(12) United States Patent
Horie

(10) Patent No.: US 7,746,261 B2
(45) Date of Patent: Jun. 29, 2010

(54) VARIABLE GAIN AMPLIFIER AND D/A CONVERTER

(75) Inventor: Masakiyo Horie, Gamagori (JP)

(73) Assignee: DENSO CORPORATION, Kariya (JP)

( * ) Notice: Subject to any disclaimer, the term of this patent is extended or adjusted under 35 U.S.C. 154(b) by 75 days.

(21) Appl. No.: 12/219,963

(22) Filed: Jul. 31, 2008

(65) Prior Publication Data

US 2009/0033535 A1 Feb. 5, 2009

(30) Foreign Application Priority Data

Aug. 1, 2007 (JP) .............................. 2007-200836
Apr. 1, 2008 (JP) .............................. 2008-094909

(51) Int. Cl.
*H03M 1/66* (2006.01)
(52) U.S. Cl. ...................................... 341/150; 341/144
(58) Field of Classification Search ................. 341/150, 341/144; 327/91; 330/282
See application file for complete search history.

(56) References Cited

U.S. PATENT DOCUMENTS

| | | | |
|---|---|---|---|
| 4,746,903 A | | 5/1988 | Czarniak et al. |
| 5,281,867 A | * | 1/1994 | Campbell et al. ............. 327/91 |
| 5,995,035 A | | 11/1999 | Signell et al. |
| 6,028,546 A | | 2/2000 | Signell et al. |
| 6,078,276 A | | 6/2000 | Signell et al. |
| 6,714,075 B2 | | 3/2004 | Morie et al. |
| 6,958,655 B2 | * | 10/2005 | Shirai ......................... 330/282 |
| 2003/0179122 A1 | * | 9/2003 | Yamamura .................. 341/150 |
| 2008/0074304 A1 | | 3/2008 | Horie |
| 2008/0094272 A1 | | 4/2008 | Horie |

FOREIGN PATENT DOCUMENTS

| JP | A-S58-47328 | 3/1983 |
|---|---|---|
| JP | A-2003-087068 | 3/2003 |

OTHER PUBLICATIONS

U.S. Appl. No. 12/076,451, filed Mar. 19, 2008, Taguchi et al.
U.S. Appl. No. 12/155,017, filed May 29, 2008, Ito et al.
U.S. Appl. No. 12/089,963, filed Apr. 8, 2008, Ueda.
Notice of Reason for Refusal issued from the Japanese Patent Office mailed on Aug. 18, 2009 in the corresponding Japanese patent application No. 2008-094909 (and English translation).

* cited by examiner

*Primary Examiner*—Jean B Jeanglaude
(74) *Attorney, Agent, or Firm*—Posz Law Group, PLC

(57) ABSTRACT

A variable gain amplifier for amplifying an input voltage at a gain defined by a binary code includes: a signal input terminal; a signal output terminal; a charge division means that accumulates a charge, divides an accumulated charge, and accumulates a divided charge; a charge cumulation means that accumulates a charge, adds or subtracts an accumulated charge with or from the divided charge in the charge division means, and accumulates a resultant charge; and a controller that initially executes to accumulate the charge corresponding to the input voltage in the charge division means, executes to accumulate the charge corresponding to the input voltage or a predetermined voltage in the charge cumulation means, executes a charge dividing operation according to each bit of the binary code sequentially from a most significant bit, and executes a charge adding or subtracting operation according to an data value in each bit.

20 Claims, 21 Drawing Sheets

FIG. 12

| | XA | XB | XD | XB | XD | XB | XC | XIA | XIB | |
|---|---|---|---|---|---|---|---|---|---|---|
| SW Sf | ON | OFF | ON | OFF | | | | ON | OFF | |
| SW S1a | Vrefp | Vout | | | | | | Vin | Vout | |
| SW S1b | ON | | ON | | OFF | ON | | | ON | |
| SW S1c | OFF | | | OFF | ON | OFF | | ON | OFF | |
| SW S2a | | | Vout | Vrefm | Vout | Vrefm | Vin | | | |
| SW S2b | ON | | | | | | | OFF | | |
| SW S2c | OFF | | | | | | | ON | | |
| SW S3a | Vout | | | | | | | | | |
| SW S3b | ON | OFF | | | | | ON | | | |
| CHARGE OF C1 | CVrefp | 1/2·CVrefp | 1/4·CVrefp | 1/8·CVrefp | | | | C·(Vin−1/8·Vrefp) | 1/2·C·(Vin−1/8·Vrefp) | |
| CHARGE OF C2 | 0 | 1/2·CVrefp | 1/4·CVrefp | 0 | | | 1/8·CVrefp | 0 | 0 | |
| CHARGE OF C3 | 0 | 0 | 0 | 1/8·CVrefp | | | | 0 | 1/2·C·(Vin−1/8·Vrefp) | |
| Vout | 0 | 1/2·Vrefp | 1/4·Vrefp | 1/8·Vrefp | | | | 0 | 0 | |
| | SAMPLING | K1=0 | K2=0 | K3=1 | | | | K1=1 | | |
| | | D/A CONVERT OPE. (1/8·Vrefp) | | | | | | SAMPLING A DIFFERENCE BETWEEN INPUT V AND D/A CONVERT VAL. | AMP. OPE. | |

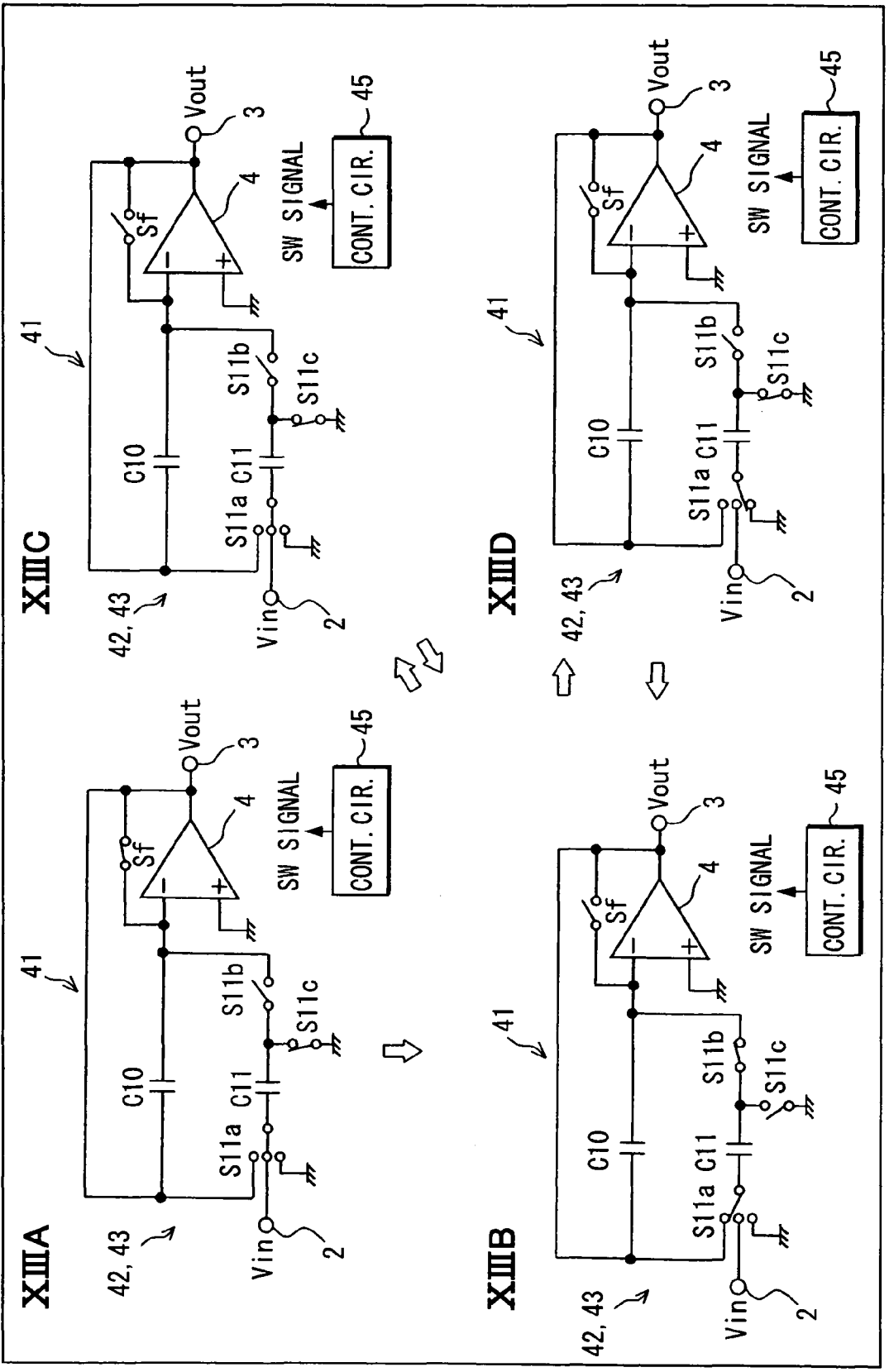

VARIABLE GAIN AMPLIFIER AND D/A CONVERTER

CROSS REFERENCE TO RELATED APPLICATIONS

This application is based on Japanese Patent Applications No. 2007-200836 filed on Aug. 1, 2007, and No. 2008-94909 filed on Apr. 1, 2008, the disclosures of which are incorporated herein by reference.

FIELD OF THE INVENTION

The present invention relates to a variable gain amplifier and a D/A converter.

BACKGROUND OF THE INVENTION

In a power train control system, a vehicle control system, a body control system, and an information communication system mounted in a vehicle, a lot of sensors are used to sense an ambient environment of the vehicle and the operating states of various facilities, such as, the temperature, the burning state in an engine, the operating states of various actuators, an air intake/exhaust state, the posture of the vehicle, and the state of a battery. Various sensors convert a change in a specific physical or chemical quantity into a change in an amount of electricity, that is, a change in a voltage, a current, or an electrostatic capacitance on the basis of various physical or electrochemical principles.

Generally, a voltage output level sent from a sensor is often so small as to range from several millivolts to several hundreds of millivolts. On the other hand, an input dynamic range or a convertible voltage range of an analog-to-digital (A/D) converter incorporated in an automobile microcomputer or the like is, generally, a range from 0 V to 5 V. If a feeble signal sent from the sensor is A/D-converted as it is, the dynamic range of the A/D converter cannot be effectively utilized. Therefore, an amplifier that exhibits an appropriate magnification is often disposed in a stage preceding the A/D converter.

Moreover, a variance of one sensor from the others caused during manufacture brings about a variance in the sensitivity of the sensor or an offset. Therefore, a correction or compensation means is generally included in a processing circuit. A typical correction or compensation means is realized with a microcomputer in an electronic control unit (ECU). After each sensor is connected to the ECU, a signal sent from the sensor is amplified at an appropriate fixed magnification in the ECU, and A/D-converted. The ECU then executes a correctional or compensational arithmetic operation for the resultant signal.

When the foregoing means compensates an offset voltage derived from a sensor, simple addition/subtraction processing should merely be performed. However, for correcting sensitivity, multiplication/division processing is needed. If the number of sensors is large, a processing load for the correctional or compensational arithmetic processing increases.

In recent years, a processing load incurred by an ECU has greatly increased along with the complexity in vehicle control. A movement of separating from the ECU by incorporating a preprocessing circuit for a sensor signal in a sensor has been accelerated. Moreover, the number of harnesses over which sensors and ECUs are interconnected is increasing along with an increase in the number of sensors. The number of cases where the individual sensors and ECUs are interconnected over an onboard LAN (CAN or LIN) for which a certain communications protocol is defined, but are not interconnected over independent harnesses is increasing.

In such a configuration, each of the sensors executes not only amplification of a sensor output signal and A/D conversion but also simple processing succeeding the conversion. The results of the execution, that is, a digital value is sent to each ECU over a bus of the LAN. In this case, if the sensors simultaneously execute sensor variance compensation and send their sensor output values, which have been compensated and normalized, to the respective ECUs, it would be more preferable.

Broadly, a means for performing correction or compensation in a sensor falls into two types. One of the types is a type of means for correcting or compensating an analog signal that has not been A/D-converted, and the other type is a type of means for executing correctional or compensational arithmetic processing for an A/D-converted value or a digital value similarly to correction or compensation to be performed in an ECU.

Talking of correction processing and compensation processing, compensation of an offset that is a stationary deviation in a sensor output is addition/subtraction processing, and can be implemented using a relatively simple means. Supposing the addition/subtraction processing is analog processing, it can be implemented using a D/A converter and a subtraction processing circuit which is easily constructed using an operational amplifier. Supposing the addition/subtraction processing is digital processing, it can be implemented using an adder alone. In contrast, sensitivity correction requires multiplication/division processing. Supposing the multiplication/division processing is analog processing, a variable gain amplifier or a voltage division circuit that supports a variable voltage division ratio is needed. Supposing the multiplication/division processing is digital processing, a multiplier or a microprocessing unit (MPU) is needed. In either case, compared with the offset compensation means, the sensitivity correction means will become large in a circuit scale.

JP-A-2003-87068 and JP-A-2003-218650 (corresponding to U.S. Pat. No. 6,714,075) have introduced variable gain amplifiers. The variable gain amplifier described in JP-A-2003-87068 employs an operational amplifier and an R-2R resistor circuit and supports a variable gain according to an N-bit digital signal. Moreover, the variable gain amplifier described in JP-A-2003-218650 employs a multi-bit resistor string.

In both of the variable gain amplifiers, a variation width of a gain or an adjustable width thereof is reduced by increasing the number of resistors. Therefore, although a gain can be designated in finer steps, an increase in an occupied area in a layout is unavoidable. Moreover, the precision in a gain depends on the specific precision in a resistance. However, when an attempt is made to improve the specific precision in a resistance in an LSI, the size of a resistor has to be increased. This leads to a further increase in the occupied area in a layout.

Thus, it is require to provide a variable gain amplifier that can attain a gain permitting an arbitrary resolution although the variable gain amplifier is realized with one circuit of a small circuit scale without the employment of a resistor string, and a D/A converter.

SUMMARY OF THE INVENTION

In view of the above-described problem, it is an object of the present disclosure to provide a variable gain amplifier. It is another object of the present disclosure to provide a D/A converter.

According to a first aspect of the present disclosure, a variable gain amplifier for amplifying an input voltage at a gain defined by a binary code includes: a signal input terminal that inputs the input voltage therein; a signal output terminal that outputs an amplified voltage therethrough; a charge division means that accumulates a charge, divides an accumulated charge according to a predetermined ratio, and accumulates a divided charge again; a charge cumulation means that accumulates a charge, adds or subtracts an accumulated charge with or from the divided charge accumulated in the charge division means, and accumulates a resultant charge again; and a controller that initially executes to accumulate the charge corresponding to the input voltage in the charge division means, executes to accumulate the charge corresponding to the input voltage or a predetermined voltage in the charge cumulation means, executes a charge dividing operation by the charge division means according to each bit of the binary code sequentially from a most significant bit, and executes a charge adding or subtracting operation by the charge cumulation means according to an data value in each bit.

In the above amplifier, when the cycling operation is performed n times (where n denotes a value equal to or larger than 1), a gain permitting an n-bit resolution defined by a binary code can be attained. Consequently, a gain permitting an arbitrary resolution can be attained by increasing the number of times of cycling without the necessity of increasing the number of capacitors according to a resolution. Compared with the conventional variable gain amplifier, an occupied area in a layout can be decreased.

According to a second aspect of the present disclosure, a variable gain amplifier for amplifying an input voltage at a gain defined by a binary code includes: a signal input terminal that inputs the input voltage therein; a signal output terminal that outputs an amplified voltage therethrough; a charge cumulation means that accumulates a charge, and cumulatively adds a charge corresponding to the input voltage or a predetermined voltage to an accumulated charge according to a data value in each bit of the binary code; a charge division means that divides the charge accumulated in the charge cumulation means with a predetermined ratio, and accumulates a divided charge; and a control means that initializes the charge accumulated in the charge cumulation means, executes a charge cumulating operation by the charge cumulation means and a charge dividing operation by the charge division means according to each bit of the binary code sequentially from a least significant bit.

In the above amplifier, when the cycling operation is performed n times (where n denotes a value equal to or larger than 1), a gain permitting an n-bit resolution defined by a binary code can be attained. Consequently, a gain permitting an arbitrary resolution can be attained by increasing the number of times of cycling without the necessity of increasing the number of capacitors according to a resolution. Compared with the conventional variable gain amplifier, an occupied area in a layout can be decreased.

According to a third aspect of the present disclosure, a variable gain amplifier for amplifying an input voltage at a gain defined by a binary code includes: a signal input terminal that inputs the input voltage therein; a signal output terminal that outputs an amplified voltage therethrough; an operational amplifier having a non-inverting input terminal held at a predetermined potential and an output terminal connected to the signal output terminal; first, second, and third capacitors, each of which includes one end connectable to the output terminal of the operational amplifier and the other end connectable to the non-inverting input terminal of the operational amplifier; and a control means. The control means executes a first process and a second process. The control means further executes to repeat a third process and the second process alternately, or to repeat a fourth process and the second process alternately according to a predetermined requirement. In the first process, a charge corresponding to the input voltage is accumulated at least in the first capacitor. In the second process, the first and second capacitors are connected between the output terminal and an inverting input terminal of the operational amplifier in order to distribute an accumulated charge of the first capacitor between the first and second capacitors with maintaining a charge in the third capacitor. In the third process, the second capacitor is switched to a predetermined charge state with maintaining the charges in the first and third capacitors. In the fourth process, the third capacitor is connected between the output terminal and the inverting input terminal of the operational amplifier in order to transfer the charge in the second capacitor to the third capacitor with maintaining the charge in the first capacitor.

In the above amplifier, when the cycling operation is performed n times (where n denotes a value equal to or larger than 1), a gain permitting an n-bit resolution defined by a binary code can be attained. Consequently, a gain permitting an arbitrary resolution can be attained by increasing the number of times of cycling without the necessity of increasing the number of capacitors according to a resolution. Compared with the conventional variable gain amplifier, an occupied area in a layout can be decreased.

According to a fourth aspect of the present disclosure, a variable gain amplifier for amplifying an input voltage at a predetermined gain includes: a signal input terminal that inputs the input voltage therein; a signal output terminal that outputs an amplified voltage therethrough; an operational amplifier having a non-inverting input terminal held at a predetermined potential and output terminal connected to the signal output terminal; a first capacitor connectable between the output terminal and an inverting input terminal of the operational amplifier; a second capacitor having one end connectable at least to the output terminal of the operational amplifier and the other end connectable at least to the inverting input terminal of the operational amplifier; and a control means. The control means executes a first process and a second process. The control means further executes to repeat a third process and the second process alternately according to a predetermined requirement. In the first process, the charge corresponding to the input voltage is accumulated at least in each of the first and second capacitors. In the second process, the first capacitor is connected between the output terminal and the inverting input terminal of the operational amplifier, and the other end of the second capacitor is connected to the inverting input terminal of the operational amplifier in order to transfer the charge of the second capacitor to the first capacitor. In the third process, the other end of the second capacitor is disconnected to the inverting input terminal of the operational amplifier with connecting the first capacitor between the output terminal and the inverting input terminal of the operational amplifier, and the one end of the second capacitor is connected to the output terminal of the operational amplifier in order to accumulate a charge corresponding to an output voltage in the second capacitor.

In the above amplifier, a gain equivalent to a magnification of the n-th power of 2 can be attained by increasing the number of times of cycling without the necessity of increasing the number of capacitors. Compared with the conventional variable gain amplifier, an occupied area in a layout can be reduced.

According to a fifth aspect of the present disclosure, a D/A converter for converting a reference voltage to an analog voltage according to a binary code and outputting the analog voltage, the converter includes: a signal output terminal that outputs the analog voltage therethrough; a charge division means that accumulates a charge therein, divides an accumulated charge according to a predetermined ratio, and accumulates a divided charge again; a charge cumulation means that accumulates a charge therein, adds an accumulated charge to the charge accumulated in the charge division means, and accumulates an added charge again; and a control means. The control means initially executes to accumulate a charge corresponding to the reference voltage in the charge division means. The control means initializes the charge accumulated in the charge cumulation means. The control means executes a charge dividing operation by the charge division means according to each bit of a binary code sequentially from a most significant bit. The control means executes a charge adding operation by the charge cumulation means according to an data value in each bit.

In the above converter, D/A conversion can be achieved at a resolution corresponding to the number of bits, which constitute the binary code, without the necessity of increasing the number of circuit elements according to the resolution. Compared with the conventional D/A converter, an occupied area in a layout can be reduced.

According to a sixth aspect of the present disclosure, a D/A converter for converting a reference voltage to an analog voltage according to a binary code and outputting the analog voltage, the converter includes: a signal output terminal that outputs the analog voltage therethrough; a charge cumulation means that accumulates charge therein, cumulatively adds an accumulated charge to a charge corresponding to the reference voltage or a predetermined charge, which is different from the charge corresponding to the reference voltage, according to a data value in each bit of the binary code; a charge division means that divides the charge accumulated in the charge cumulation means according to a predetermined ratio, and accumulates a divided charge therein; and a control means. The control means initializes the charge accumulated in the charge cumulation means. The control means executes a charge cumulating operation by the charge cumulation means and a charge dividing operation by the charge division means according to each bit of the binary code sequentially from a least significant bit.

In the above converter, D/A conversion can be achieved at a resolution corresponding to the number of bits, which constitute the binary code, without the necessity of increasing the number of circuit elements according to the resolution. Compared with the conventional D/A converter, an occupied area in a layout can be reduced.

According to a seventh aspect of the present disclosure, a D/A converter for converting a reference voltage to an analog voltage according to a digital value and outputting the analog voltage, the converter includes: a signal output terminal that outputs the analog voltage therethrough; an operational amplifier having a non-inverting input terminal held at a predetermined potential and an output terminal connected to the signal output terminal; first, second, and third capacitors, wherein one end of each capacitor is connected or connectable at least to the output terminal of the operational amplifier, and the other end of each capacitor is connected or connectable to the inverting input terminal of the operational amplifier; and a control means. The control means executes first to fourth processes. In the first process, the charge corresponding to the reference voltage is accumulated in the first capacitor, and the charges in the second and third capacitors are initialized. In the second process, the first and second capacitors are connected between the output terminal and the inverting input terminal of the operational amplifier in order to distribute the charge between the first and second capacitors with maintaining the charge in the third capacitor. In the third process, the charge in the second capacitor is initialized with maintaining the charges in the first and third capacitors according to each bit of the digital value sequentially from a higher bit to a lower bit. In the third process, when one bit represents a first logical level, a starting point is provided by the second process. In the fourth process, when one bit represents a second logical level, a starting point is provided by the second process. In the fourth process, the third capacitor is connected between the output terminal and the inverting input terminal of the operational amplifier in order to transfer the charge in the second capacitor to the third capacitor with maintaining the charge in the first capacitor.

In the above converter, D/A conversion can be achieved at a resolution corresponding to the number of bits, which constitute the binary code, without the necessity of increasing the number of circuit elements according to the resolution. Compared with the conventional D/A converter, an occupied area in a layout can be reduced.

According to an eighth aspect of the present disclosure, a variable gain amplifier for converting a reference voltage into an analog voltage according to a digital value, offsetting an input voltage by the analog voltage, amplifying an offset input voltage at a designated gain, and outputting an amplified voltage, the amplifier includes: a signal input terminal that inputs the input voltage therein; a signal output terminal that outputs the amplified voltage therethrough; an operational amplifier having a non-inverting input terminal held at a predetermined potential and an output terminal connected to the signal output terminal; first, second, and third capacitors, each of which includes one end connectable or connected to at least the output terminal of the operational amplifier and the other end connectable or connected to the non-inverting input terminal of the operational amplifier; and a control means. The control means executes first to fourth processes so that the reference voltage is converted to the analog voltage corresponding to the digital value. In the first process, the charge corresponding to the reference voltage is accumulated in the first capacitor, and the charges in the second and third capacitors are initialized. In the second process, the first and second capacitors are connected between the output terminal and the inverting input terminal of the operational amplifier in order to distribute the charge between the first and second capacitors with maintaining the charge in the third capacitor. In the third process, the charge in the second capacitor is initialized with maintaining the charges in the first and third capacitors according to each bit of the digital value sequentially from a higher bit to a lower bit. In the third process, when one bit represents a first logical level, a starting point is provided by the second process. In the fourth process, when one bit represents a second logical level, a starting point is provided by the second process. In the fourth process, the third capacitor is connected between the output terminal and the inverting input terminal of the operational amplifier in order to transfer the charge in the second capacitor to the third capacitor with maintaining the charge in the first capacitor. The control means further executes a fifth process and a sixth process, and furthermore, executes to repeat a seventh process and the sixth process alternately, or to repeat an eighth process and the sixth process alternately according to a predetermined requirement, so that the offset input voltage is amplified at the designated gain. In the fifth process, a charge corresponding to a difference between the input voltage and the analog voltage is accumulated in the first and second capacitors. In the sixth process, the first and third capacitors are connected between the output terminal and an inverting input terminal of the operational amplifier in order to distribute the charge between the first and third capacitors with maintaining the charge in the second capacitor. In the seventh process, the third capacitor is switched to a predetermined charge state with maintaining the charges in the first and second capacitors. In the eighth process, the second capacitor is connected between the output terminal and the inverting input terminal of the operational amplifier in order to transfer the charge in the third capacitor to the second capacitor with maintaining the charge in the first capacitor.

In the above amplifier, an analog voltage based on a digital value or binary code can be produced through D/A conversion without an increase in the number of capacitors. Further, a gain permitting an arbitrary resolution can be designated by determining an arbitrary number of times of cycling for the input voltage Vin that is offset by the analog voltage.

BRIEF DESCRIPTION OF THE DRAWINGS

The above and other objects, features and advantages of the present invention will become more apparent from the following detailed description made with reference to the accompanying drawings. In the drawings:

FIG. 12 is a timing chart concerning a case where after a digital value of 001 is D/A-converted, a voltage produced by offsetting an input voltage Vin by a D/A-converted output voltage is amplified at a gain corresponding to a magnification equal to or larger than 1 and equal to smaller than 2;

FIG. 13 is equivalent to FIG. 1 and show a fifth embodiment;

DETAILED DESCRIPTION OF THE PREFERRED EMBODIMENTS

A variable gain amplifier amplifies an input voltage at a designated gain, and a digital-to-analog (D/A) converter converts a reference voltage into an analog voltage according to a digital value.

First Embodiment

Referring to FIG. 1 to FIG. 6, a first embodiment is applied will be described below.

Figure 1:
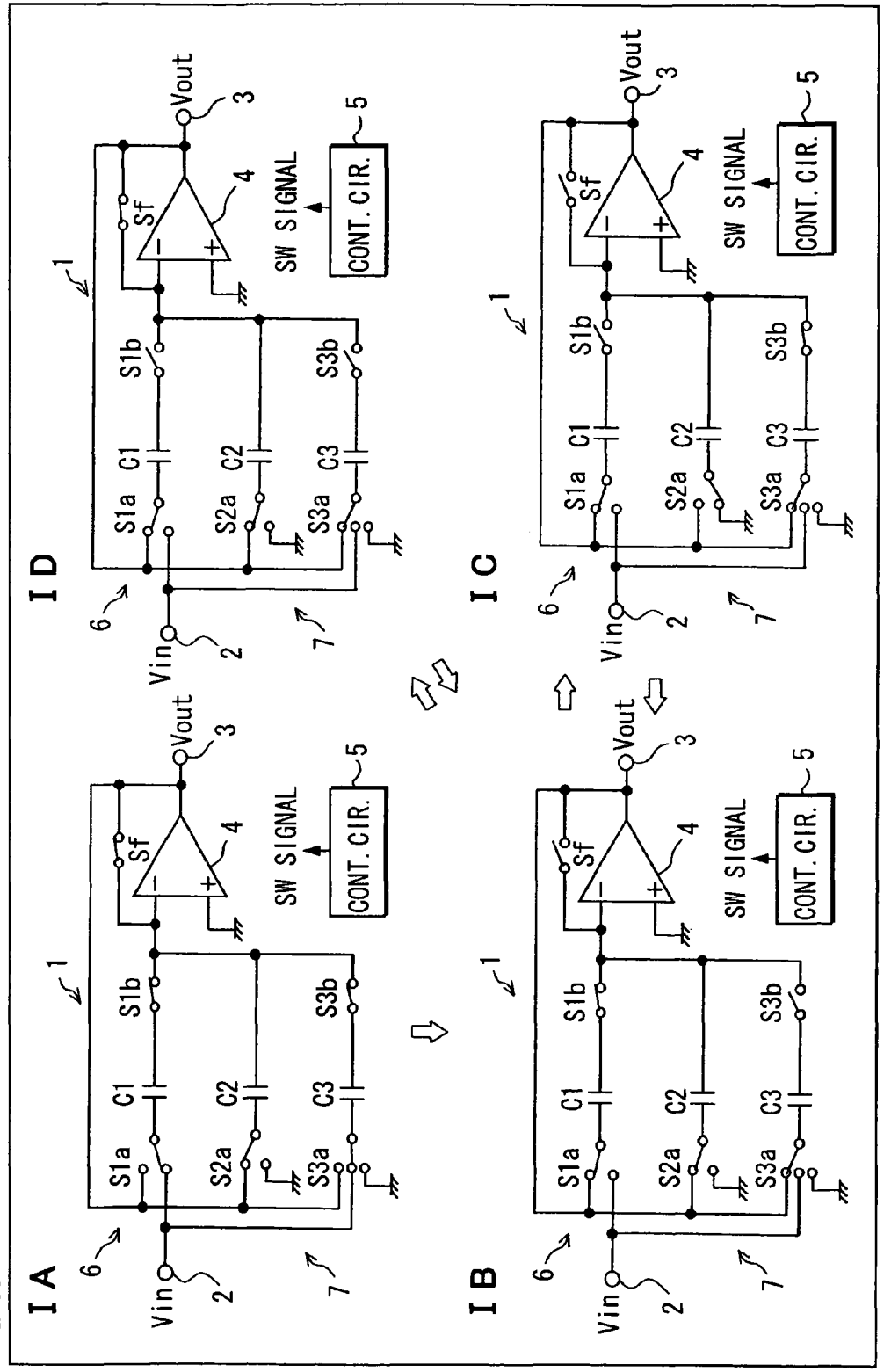
FIG. 1 shows the circuitry of a variable gain amplifier in accordance with a first embodiment, and switched states of switches.

FIG. 1 shows the circuitry of a variable gain amplifier and switched states of switches. The variable gain amplifier 1 is included, for example, in a microcomputer incorporated in an ECU in a vehicle or in a signal processing circuit or the like accompanying an onboard sensor. The variable gain amplifier 1 amplifies a sensor output signal while compensating an unavoidable variance in sensitivity of a sensor or an offset using a gain designated for each sensor. Herein, a voltage Vin of a sensor signal is inputted through a signal input terminal 2, a voltage Vout of a signal amplified at a gain defined with a binary code is outputted through a signal output terminal 3.

The variable gain amplifier 1 includes an operational amplifier 4, capacitors C1, C2, and C3 equivalent to first, second, and third capacitors, and switches S1a, S1b, S2a, S3a, S3b, and Sf. The capacitors C1, C2, and C3 exhibit the same electrostatic capacitance C. The switches S1a to Sf are formed with analog switches, and have the states thereof switched with a switching signal outputted from a control circuit 5 that is equivalent to a control means and is included in the microcomputer in an ECU or the signal processing circuit for each sensor.

Ones of the terminals of the capacitors C1 and C3 are connected to the signal input terminal 2 or the output terminal of the operational amplifier 4 by switching the states of the switches S1a and S3a. One of the terminals of the capacitor C2 is connected to a ground line held at a predetermined potential Vrefm or the output terminal of the operational amplifier 4 by switching the states of the switch S2a. The other terminal of the capacitor C2 is connected to the inverting input terminal of the operational amplifier 4. The other terminals of the capacitors C1 and C3 are connected to the inverting input terminal of the operational amplifier 4 via the switches S1b and S3b respectively. The noninverting input terminal and output terminal of the operational amplifier 4 are connected to the ground line and signal output terminal 3 respectively. The switch Sf is connected between the output terminal of the operational amplifier 4 and the inverting input terminal thereof.

A charge division means 6 includes the operational amplifier 4 and the capacitors C1 and C2. Initially, the charge dependent on the input voltage Vin is accumulated in the capacitor C1, and the accumulated charge is divided according to a preset ratio of 1/2. The fractional charge is accumulated in the capacitors C1 and C2. A charge cumulation means 7 includes the operational amplifier 4 and the capacitors C2 and C3. Initially, the charge dependent on the input voltage Vin or the predetermined voltage Vrefm of 0 V is accumulated in the capacitor C3. The accumulated charge is added to the charge accumulated in the capacitor C2 of the charge division means 6. The result of the addition is accumulated again.

FIG. 1 shows the first state, second state, third state, and fourth state which are termed in the present invention and are equivalent to a sampling state IA for the input voltage Vin, a charge distributing state IB or a voltage dividing state IB in which charge is distributed between the capacitors C1 and C2, a charge initializing state ID for the capacitor C2, and a charge adding state IC in which charge is transferred from the capacitor C2 to the capacitor C3. Arrows among the drawings signify that a transition may be made from one state to another in the course of amplification.

FIG. 2 to FIG. 5 are timing charts concerning cases where a gain designated for the variable gain amplifier 1 is 5/4, 9/8, 13/8, or 7/8. The cases will be described below.

Figure 2:
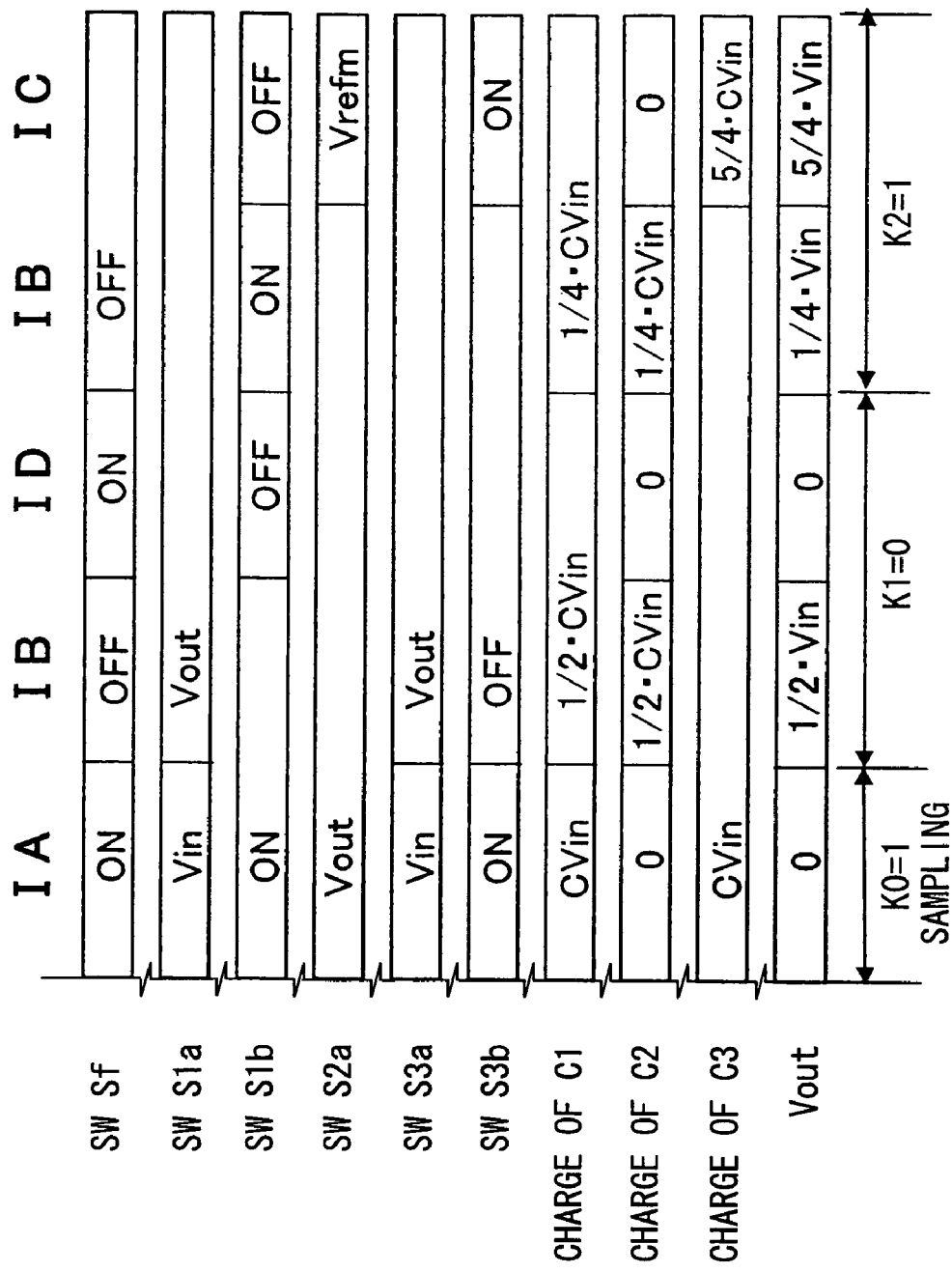
FIG. 2 is a timing chart concerning a case where a designated gain is 5/4.

(Case where the Designated Gain is 5/4: FIG. 2)

The gain 5/4 or 1.25 to be designated in this case is larger than 1. Therefore, first, the switches S1b, S3b, and Sf are turned on, and the states of the switches S1a and S3a are switched to close the connections to the signal input terminal 2 (Vin). The states of the switch 2a are switched to close the connection to the signal output terminal 3 (Vout). In this initial sampling state IA, charge CVin dependent on the input voltage Vin is sampled and accumulated in the capacitors C1 and C3. The charge in the remaining capacitor C2 is initialized to a nil. At this time, the output voltage Vout is 0 V.

Thereafter, after the switches Sf and S3b are turned off, the states of the switches S1a and S3a are switched to close the connections to the signal output terminal 3 (Vout). The sampling state IA is then changed to the charge distributing state IB. In the charge distributing state IB, the charge in the capacitor C3 is preserved. Since the capacitors C1 and C2 sharing the same capacitance are connected between the output terminal of the operational amplifier 4 and the inverting input terminal thereof, charge is therefore equally distributed or divided between the capacitors C1 and C2. Consequently, the charges in the capacitors C1 and C2 respectively come to be expressed as 1/2·CVin. Namely, a charge dividing operation is implemented by the charge division means 6.

Since the gain designated in this case, that is, 5/4 or 1.25 is smaller than 3/2, that is, 1+1/2=1.5, the addition of the charge in the capacitor C2 expressed as 1/2·CVin is not needed. After the switch S1b is turned off, the switch Sf is turned on, and the charge distributing state IB is changed to the charge initializing state ID. In the charge initializing state ID, the charge in the capacitor C2 is initialized to a nil or brought to a predetermined charged state with the charges in the capacitors C1 and C3 left preserved. At this time, the output voltage Vout is 0 V.

Thereafter, after the switch Sf is turned off, the switch S1b is turned on. The charge distributing state IB is restored. In the charge distributing state IB, the charge in the capacitor C3 is preserved. Charge is equally distributed or divided between the capacitors C1 and C2. The charges in the capacitors C1 and C2 come to be expressed as 1/4·CVin. Namely, a charge dividing operation is implemented by the charge division means 6.

Since the designated gain is equal to 5/4 or 1+1/4=1.25, the switch S1b is turned off, the switch S3b is turned on, and the switch S2a has the states thereof switched to close the connection to the ground held at the predetermined potential Vrefm. The charge distributing state IB is then changed to the charge adding state IC. In the charge adding state IC, charge is distributed or transferred between the capacitors C2 and C3. The charge in the capacitor C3 becomes equal to the sum between the originally accumulated charge CVin and the charge in the capacitor C2 expressed as 1/4·CVin, that is, charge expressed as 5/4·CVin. Namely, a charge adding operation is implemented by the charge cumulation means 7. As a result, the output voltage Vout comes to be expressed as 5/4·CVin according to the designated gain.

Figure 3:
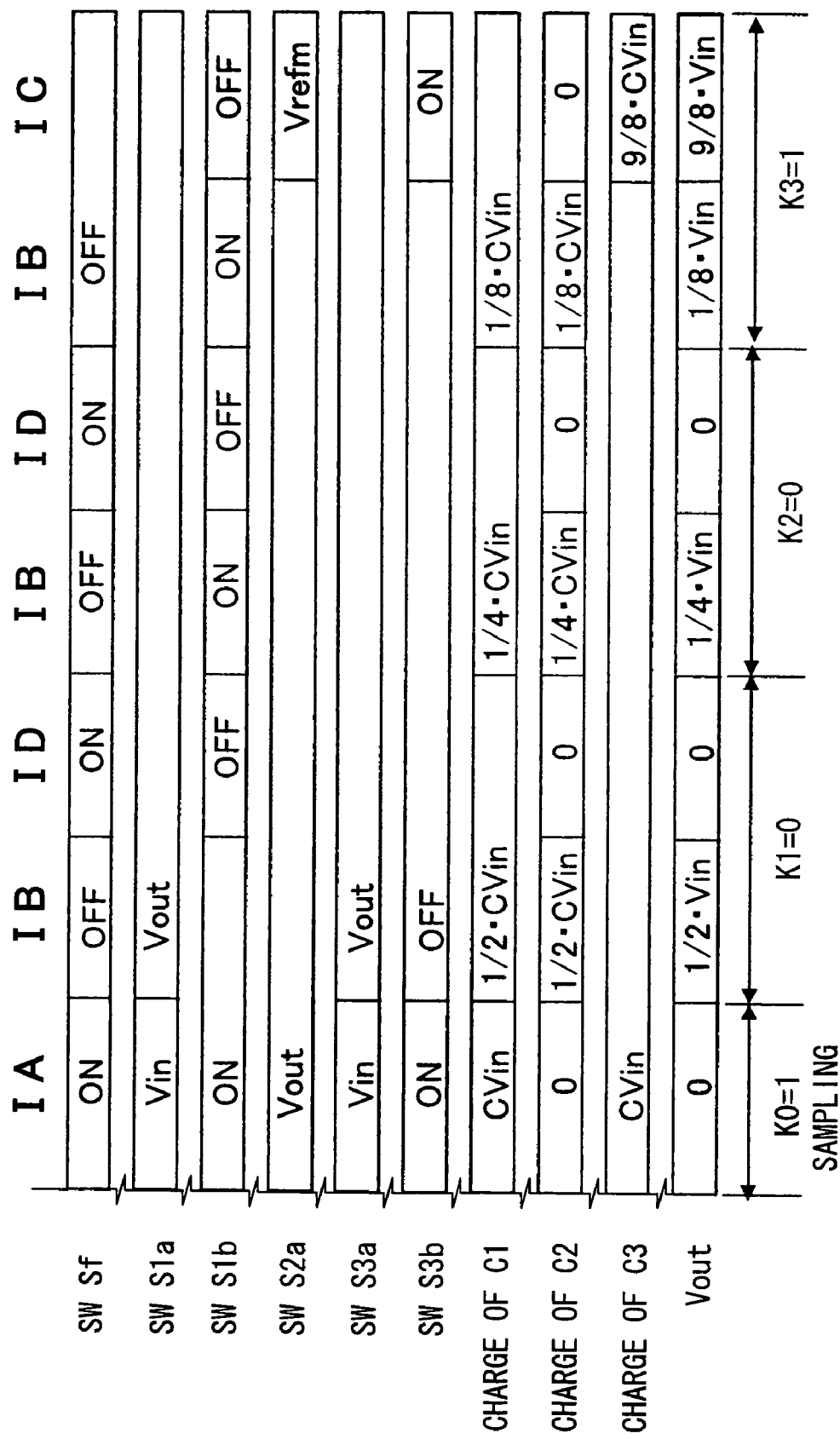
FIG. 3 is a timing chart concerning a case where a designated gain is 9/8.

[Case where the Designated Gain is 9/8: FIG. 3]

The process that the initial sampling state IA is changed to the charge distributing state IB through the charge distributing state IB and charge initializing state ID is identical to that followed in the case where the designated gain is 5/4 (see FIG. 2). Since the designated gain in this case, that is, 9/8 or 1.125 is smaller than 5/4 or 1.25, the addition of the charge in the capacitor C2 expressed as 1/4·CVin and accumulated in the charge distributing state IB is not needed. Consequently, the charge distributing state IB is changed to the charge initializing state ID again. The charge in the capacitor C2 is initialized to a nil with the charges in the capacitors C1 and C3 left preserved.

After initialization is completed, the charge distributing state IB is restored. Charge is equally distributed or divided between the capacitors C1 and C2. The charges in the capacitors C1 and C2 are expressed as 1/8·CVin. Namely, the charge dividing operation is implemented by the charge division means 6. Since the designated gain is 9/8 or 1+1/8=1.125, the charge distributing state IB is changed to the charge adding state IC. Charge is distributed or transferred between the capacitors C2 and C3. The charge in the capacitor C3 becomes equal to the sum of the originally accumulated charge CVin and the charge in the capacitor C2 expressed as 1/8·CVin, that is, charge expressed as 9/8·CVin. Namely, the charge adding operation is implemented by the charge cumulation means 7. As a result, the output voltage Vout becomes the charge expressed as 9/8·CVin according to the designated gain.

Figure 4:
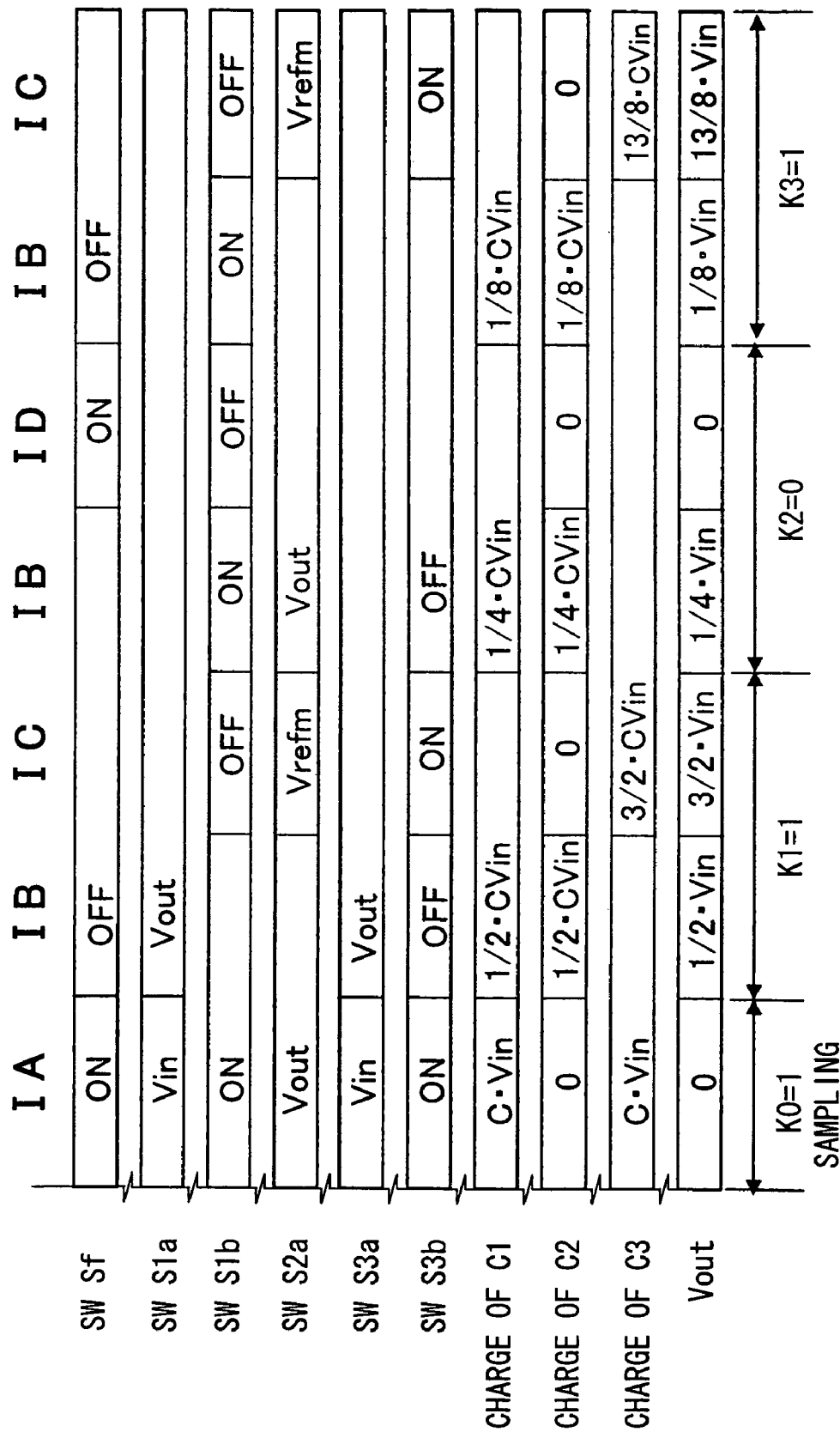
FIG. 4 is a timing chart concerning a case where a designated gain is 13/8.

[Case where the Designated Gain is 13/8: FIG. 4]

The process in which the initial sampling state IA is changed to the charge distributing state IB is identical to that followed in the case where the designated gain is 5/4 (see FIG. 2) or the designated gain is 9/8 (see FIG. 3). Since the designated gain in this case, that is, 13/8 or 1.625 is larger than 3/2 or 1+1/2=1.5, the addition of the charge in the capacitor C2 expressed as 1/2·CVin and accumulated in the charge distributing state IB is needed. Consequently, the switch S1b is turned off and the switch S3b is turned on. The switch S2a has the states thereof switched to close the connection to the ground (Vrefm). The charge distributing state IB is then changed to the charge adding state IC. In the charge adding state IC, charge is distributed or transferred between the capacitors C2 and C3. The charge in the capacitor C3 becomes equal to the sum of the originally accumulated charge expressed as CVin and the charge in the capacitor C2 expressed as 1/2·CVin, that is, charge expressed as 3/2·CVin. Namely, the charge adding operation is implemented by the charge cumulation means 7.

After the addition is completed, the charge distributing state IB is restored again. Charge is equally distributed or divided between the capacitors C1 and C2 with the charge in the capacitor C3 left preserved. Consequently, the charges in the capacitors C1 and C2 come to be expressed as 1/4·CVin. Namely, the charge dividing operation is implemented by the charge division means 6. Since the designated gain of 13/8 or 1.625 is smaller than 7/4 or 1+1/2+1/4=1.75, the addition of the charge in the capacitor C2 expressed as 1/4·CVin and accumulated in the charge distributing state IB is not needed. The charge distributing state IB is then changed to the charge initializing state ID. The charge in the capacitor C2 is initialized to a nil with the charges in the capacitors C1 and C3 left preserved.

After the initialization is completed, the charge distributing state IB is restored again. Charge is equally distributed or divided between the capacitors C1 and C2 with the charge in the capacitor C3 left preserved. The charges in the capacitors C1 and C2 come to be expressed as 1/8·CVin. Namely, the charge dividing operation is implemented by the charge division means 6. Since the designated gain is 13/8 or 1+1/2+1/8=1.625, the charge distributing state IB is changed to the charge adding state IC. Charge is distributed or transferred between the capacitors C2 and C3. The charge in the capacitor C3 becomes equal to the sum of the originally accumulated charge expressed as 3/2·CVin and the charge in the capacitor C2 expressed as 1/8·CVin, that is, charge expressed as 13/8·CVin. Namely, the charge adding operation is implemented by the charge cumulation means 7. As a result, the output voltage Vout becomes the charge expressed as 13/8·CVin according to the designated gain.

Figure 5:
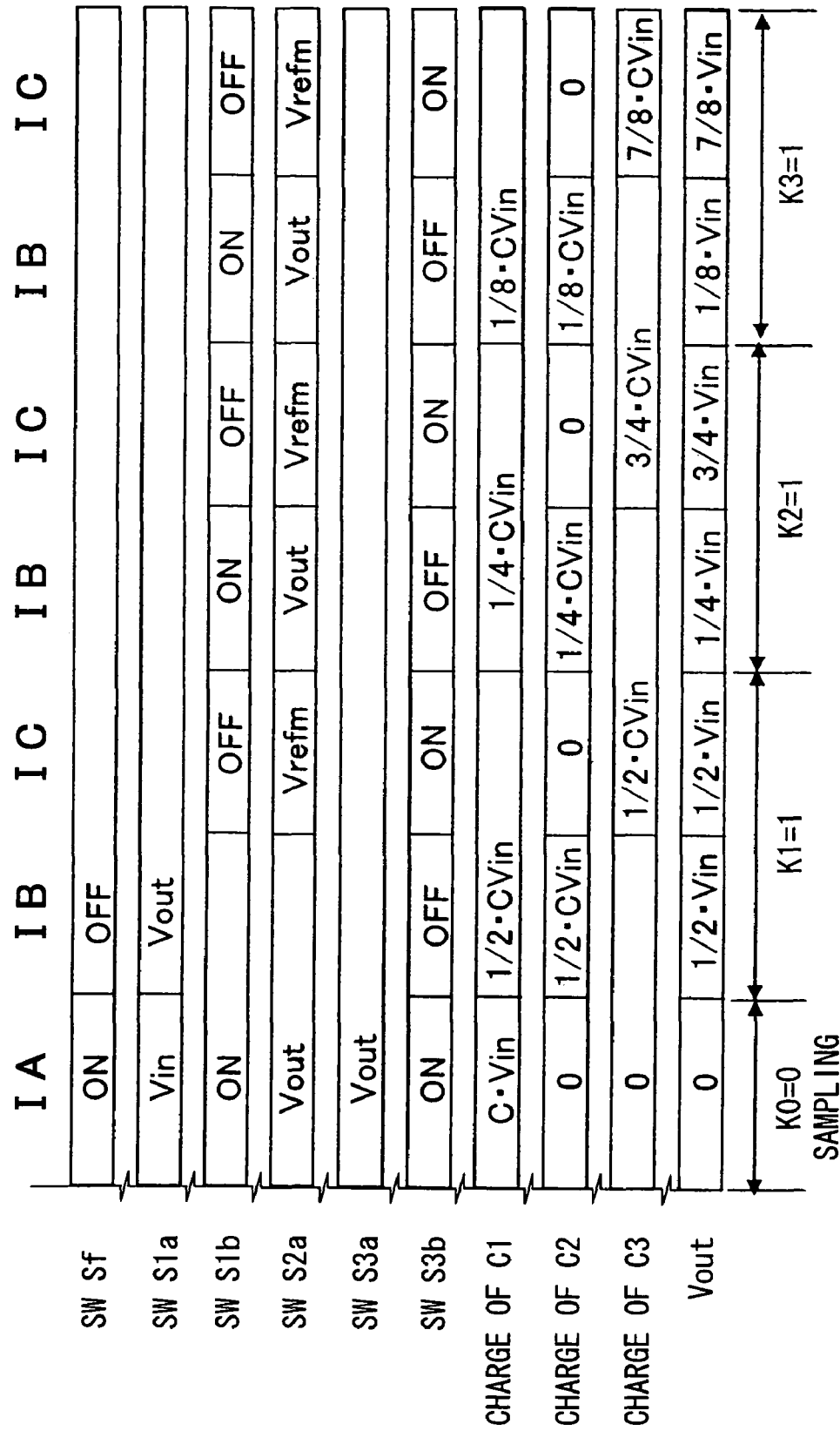
FIG. 5 is a timing chart concerning a case where a designated gain is 7/8.

[Case where the Designated Gain is 7/8: FIG. 5]

Since the designated gain in this case, that is, 7/8 or 0.875 is smaller than 1, the switches S1$b$, S3$b$, and Sf are turned on in the initial sampling state IA. The switch S1$a$ has the states thereof switched to close the connection to the signal input terminal 2 (Vin), and the switches S2$a$ and S3$a$ have the states thereof switched to close the connections to the signal output terminal 3 (Vout). Consequently, charge CVin dependent on the input voltage Vin is sampled and accumulated in the capacitor C1 alone, and the charges in the other capacitors C2 and C3 are initialized to a nil.

Thereafter, the sampling state IA is changed to the charge distributing state IB. Charge is equally distributed or divided between the capacitors C1 and C2 with the charge in the capacitor C3 left retained at a nil. The charges in the capacitors C1 and C2 come to be expressed as 1/2·CVin. Namely, the charge dividing operation is implemented by the charge division means 6. Since the designated gain of 7/8 or 0.875 is larger than 1/2 or 0.5, the addition of the charge in the capacitor C2 expressed as 1/2·CVin and accumulated in the charge distributing state IB is needed. The charge distributing state IB is then changed to the charge adding state IC. Charge is distributed or transferred between the capacitors C2 and C3. The charge in the capacitor C3 becomes equal to the sum of the originally accumulated charge 0 and the charge in the capacitor C2 expressed as 1/2·CVin, that is, charge expressed as 1/2·CVin. Namely, the charge adding operation is implemented by the charge cumulation means 7.

After the addition is completed, the charge distributing state IB is restored. Charge is equally distributed or divided between the capacitors C1 and C2 with the charge in the capacitor C3 left preserved. The charges in the capacitors C1 and C2 come to be expressed as 1/4·CVin. Namely, the charge dividing operation is implemented by the charge division means 6. Since the designated gain of 7/8 or 0.875 is larger than 3/4 or 0+1/2+1/4=0.75, the addition of the charge in the capacitor C2 expressed as 1/4·CVin and accumulated in the charge distributing state IB is needed. The charge distributing state IB is then changed to the charge adding state IC. Charge is distributed or transferred between the capacitors C2 and C3. The charge in the capacitor C3 becomes equal to the sum of the originally accumulated charge expressed as 1/2·CVin and the charge in the capacitor C2 expressed as 1/4·CVin, that is, charge expressed as 3/4·CVin. Namely, the charge adding operation is implemented by the charge cumulation means 7.

After the addition is completed, the charge distributing state IB is restored. Charge is evenly distributed or divided to the capacitors C1 and C2. The charges in the capacitors C1 and C2 come to be expressed as 1/8·CVin. Namely, the charge dividing operation is achieved by the charge division means 6. Since the designated gain is 7/8 or 0+1/2+1/4+1/8=0.875, the charge distributing state IB is changed to the charge adding state IC. Charge is distributed or transferred between the capacitors C2 and C3. The charge in the capacitor C3 becomes equal to the sum of the originally accumulated charge expressed as 3/4·CVin and the charge in the capacitor C2 expressed as 1/8·CVin, that is, charge expressed as 7/8·CVin. Namely, the charge adding operation is achieved by the charge cumulation means 7. As a result, the output voltage Vout becomes the charge expressed as 7/8·CVin according to the designated gain.

As apparent from the aforesaid four cases, an arbitrary gain Gain that is a magnification ranging from 0 to 2 is expressed according to an equation (1) below. Herein, K0, K1, K2, K3, etc., and Kn denote 0 or 1.

[Mathematics 1]

$$\text{Gain} = K0 + K1 \cdot \frac{1}{2} + K2 \cdot \left(\frac{1}{2}\right)^2 + K3 \cdot \left(\frac{1}{2}\right)^3 + \ldots + Kn \cdot \left(\frac{1}{2}\right)^n \quad (1)$$

When the gain is 5/4, K0 is set to 1, K1 is set to 0, K2 is set to 1, and K3 to Kn are set to 0. When the gain is 9/8, K0 is set to 1, K1 is set to 0, K2 is set to 0, K3 is set to 1, and K4 to Kn are set to 0. When the gain is 13/8, K0 is set to 1, K1 is set to 0, K2 is set to 0, K3 is set to 1, and K4 to Kn are set to 0. When the gain is 7/8, K0 is set to 0, K1 is set to 1, K2 is set to 1, K3 is set to 1, and K4 to Kn are to 0.

Namely, in association with each of the bits of a binary code K0K1K2 . . . Kn−1Kn sequentially from the most significant bit (MSB) that is the bit K0, the charge dividing operation to be implemented by the charge division means 6 is executed. When one of the bits represents 1, the charge adding operation to be implemented by the charge cumulation means 7 is executed. When the bit represents 0, the adding operation is left unexecuted.

In other words, when the charge distributing state IB and charge initializing state ID or the charge distributing state IB and charge adding state IC are cycled n times, a gain can be determined to permit an n-bit resolution (where n denotes a value equal to or larger than 0). When the gain is smaller than a magnification of 1, K0 is set to 0. Therefore, charge CVin dependent on the input voltage Vin is accumulated in the capacitor C1 alone in the initial sampling state IA. When the gain is equal to or larger than a magnification of 1, K0 is set to 1. Therefore, the charge CVin dependent on the input voltage Vin is accumulated in the capacitors C1 and C3 in the sampling state IA.

When Ki (where i denotes a value equal to or larger than 1) is set to 0, the i-th cycling or state transition is a transition from the charge distributing state IB through the charge initializing state ID to the charge distributing state IB. When Ki is set to 1, the i-th cycling or state transition is a transition from the charge distributing state IB through the charge adding state IC to the charge distributing state IB. When a gain is determined to permit an n-bit resolution, a cycling operation need not be repeated until the n-th cycling. When Ki is set to 1 and Ki+1, Ki+2, etc., and Kn are all set to 0, the i-th cycling alone should be completed. In any case, the cycling is terminated in the charge adding state IC.

Next, a difference between a gain determined by the variable gain amplifier 1 and a gain attained in an ideal geometric progression desirably for sensitivity correction will be discussed in relation to a case where the sensitivity of a sensor is corrected using the variable gain amplifier. A gain Gain to be attained in a case where the variable gain amplifier 1 and an amplifier capable of amplifying a signal at a magnification of a power of 2, for example, a variable gain amplifier 11 of the second embodiment to be described later are connected in series with each other is expressed by an equation (2) below.

[Mathematics 2]

$$\text{Gain} = 2^p \left(1 \pm \frac{q}{2^n}\right) \quad (2)$$

where p denotes 0, 1, 2, 3, etc., or m, and q denotes 0, 1, 2, 3, etc., or $(2^n-1)$.

Moreover, the gain Gain attained in an ideal geometric progression is expressed by an equation (3) below.

[Mathematics 3]

$$\text{Gain} = 2^{\frac{k}{2^n}} \quad (3)$$

where k denotes 0, 1, 2, 3, etc., or $(m+1)2^n$.

The difference or error, ΔG, between the gain Gain expressed by the equation (2) and the gain Gain expressed by the equation (3) is expressed by an equation (4) below. However, the relationship of association between items to be compared with each other is as indicated by an equation (5) below. When ΔG in the equation (4) is expressed in the notation of percentage, an equation (6) below is drawn out.

[Mathematics 4]

$$\Delta G = 2^p \left(1 + \frac{q}{2^n}\right) - 2^{\frac{k}{2^n}} \quad (4)$$

$$K = 2^n p + q \quad (5)$$

$$\Delta G[\%] = \left(2^p \left(1 + \frac{q}{2^n}\right) - 2^{\frac{k}{2^n}}\right) \bigg/ -2^{\frac{k}{2^n}} \times 100 \quad (6)$$

Figure 6:
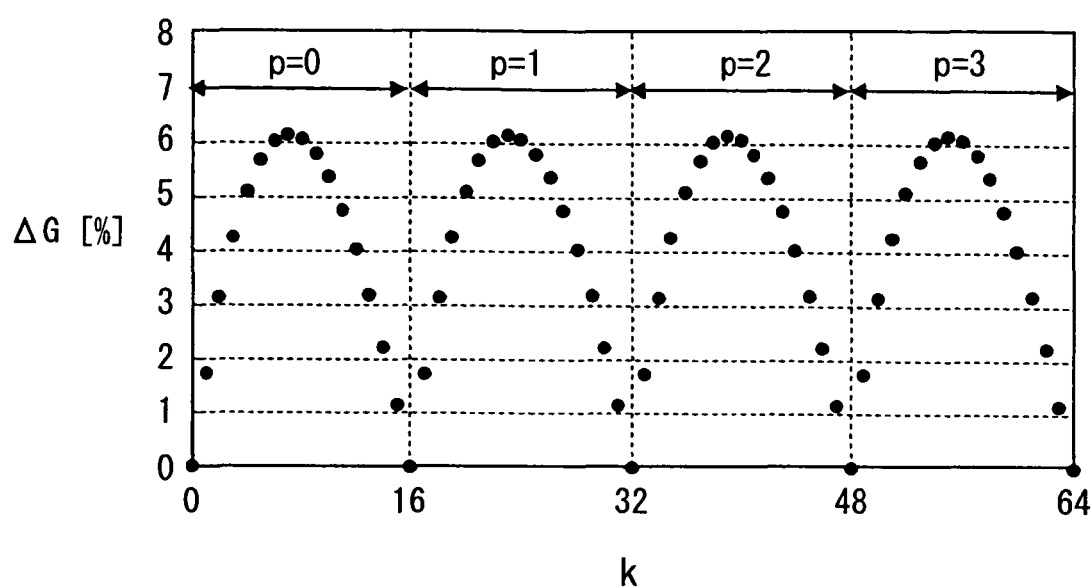
FIG. 6 shows the results of calculation of an error ΔG [%] occurring when n=4 is established.

FIG. 6 shows the results of calculation of ΔG in percentage according to the equation (6) in the case of n=4. Ideally, a gain should be able to be attained in a geometric progression. However, FIG. 6 demonstrates that even when the variable gain amplifier 1 and the variable gain amplifier 11 (see FIG. 7) capable of amplifying a signal at a magnification of a power of 2 are employed, a maximum deviation of an attained gain from a gain attained in a geometric progression is on the order of approximately 6%.

As described above, the variable gain amplifier 1 of the present embodiment includes the three capacitors C1, C2, and C3 ones of whose terminals can be connected to the output terminal of the operational amplifier 4 and the others of whose terminals are connected or can be connected to the inverting input terminal of the operational amplifier 4. The capacitor C1 is used to distribute part of charge, which is accumulated depending on the input voltage Vin, to the capacitor C2. The capacitor C2 is used to transfer only a required amount of charge out of the distributed charge to the capacitor C3. Moreover, the capacitor C3 is used to add transferred charge to originally accumulated charge and preserve the resultant charge. The output voltage Vout is determined based on the charge accumulated in the capacitor C3.

According to the present embodiment, a charge dividing operation is executed in association with each of the bits of a binary code sequentially from the most significant bit (MSB), and a charge adding operation is executed based on a value represented by each bit. Specifically, a gain can be attained for one bit by performing a cycling operation or a transitional operation of cycling once the charge distributing state IB in which charge is distributed between the capacitors C1 and C2, the charge initializing state ID for the capacitor C2, and the charge adding state IC in which charge is transferred from the capacitor C2 to the capacitor C3. When the cycling operation is performed n times (where n denotes a value equal to or larger than 1), a gain permitting an n-bit resolution defined by a binary code can be attained. Consequently, a gain permitting an arbitrary resolution can be attained by increasing the number of times of cycling without the necessity of increasing the number of capacitors according to a resolution. Compared with the conventional variable gain amplifier, an occupied area in a layout can be decreased.

Moreover, when the variable gain amplifier 1 is connected in series with an amplifier capable of amplifying a signal at a magnification of a power of 2, a gain can be attained nearly in a geometric progression. Consequently, even if there is a variance in sensitivity from one sensor to another, the variable gain amplifier 1 is used to independently and easily determine a corrective gain for sensitivity.

Second Embodiment

Next, the second embodiment is applied will be described with reference to FIG. 7.

Figure 7:
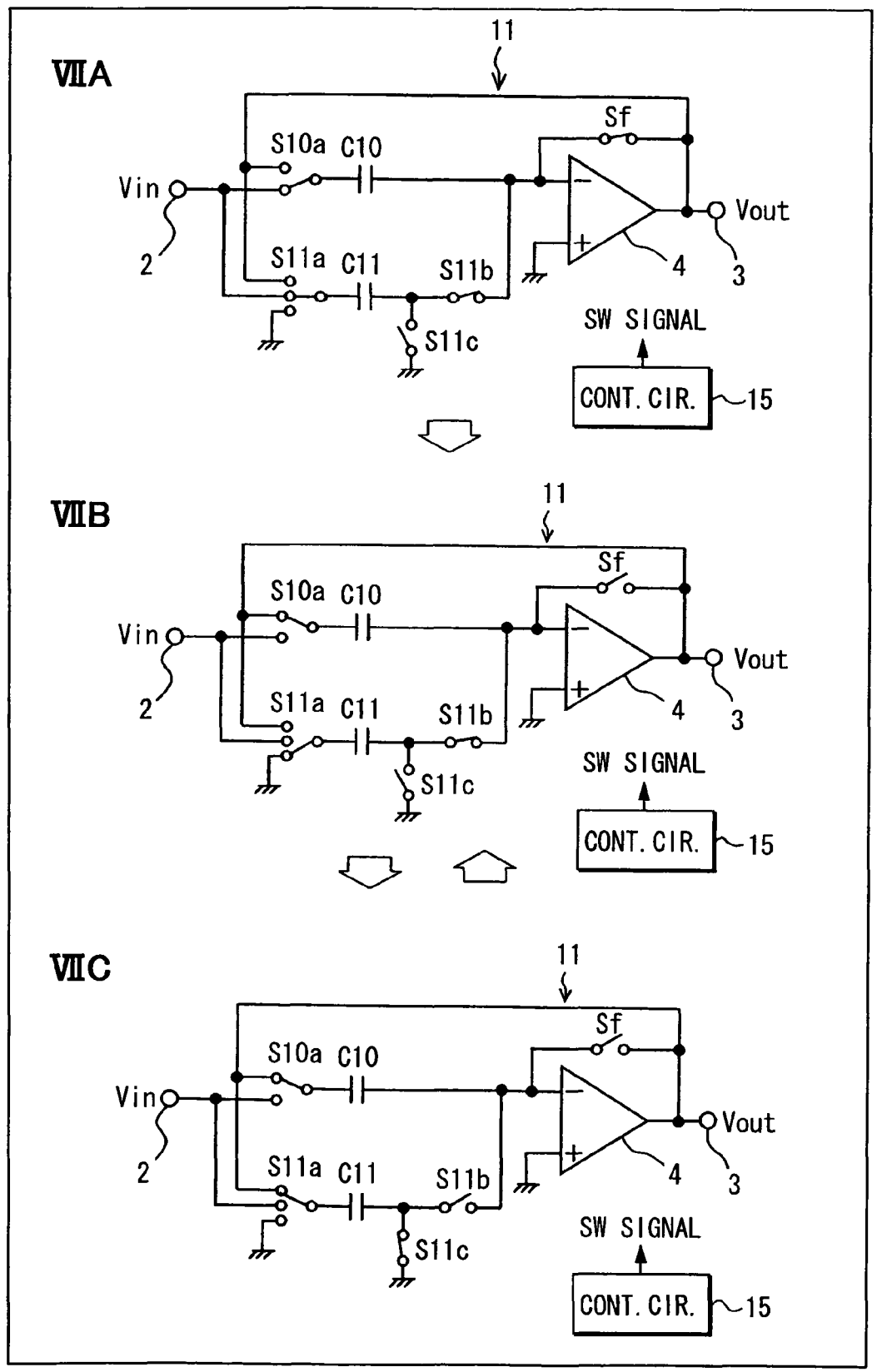
FIG. 7 shows the circuitry of a variable gain amplifier in accordance with a second embodiment, and switched states of switches.

FIG. 7 shows the circuitry of a variable gain amplifier and switched states of switches. The same reference numerals are assigned to components identical to those shown in FIG. 1. The variable gain amplifier 11 is included in a microcomputer incorporated in an ECU mounted in a vehicle or a signal processing circuit accompanying an onboard sensor. A voltage Vin of a sensor signal is inputted through a signal input terminal 2, and a voltage Vout of an amplified signal is outputted through a signal output terminal 3.

The variable gain amplifier 11 includes an operational amplifier 4, capacitors C10 and C11 equivalent to the first and second capacitors, and switches S10a, S11a, S11b, S11c, and Sf. The capacitors C10 and C11 exhibit the same electrostatic capacitance C. The switches S10a to Sf are formed with analog switches, and have the states thereof switched by a control circuit 15 that is equivalent to the control means and included in the microcomputer incorporated in the ECU or the signal processing circuit of a sensor.

The capacitor C10 can be connected between the output terminal of the operational amplifier 4 and the inverting input terminal thereof. Specifically, one of the terminals of the capacitor C10 is connected to the signal input terminal 2 or the output terminal of the operational amplifier 4 by switching the states of the switch S10a. The other terminal of the capacitor C10 is connected to the inverting input terminal of the operational amplifier 4. Moreover, one of the terminals of the capacitor C11 is connected to the signal input terminal 2, the output terminal of the operational amplifier 4, or a ground line held at a predetermined potential Vrefm by switching the states of the switch S11a. The other terminal of the capacitor C11 is connected to the inverting input terminal of the operational amplifier 4 via the switch S11b, and connected to the ground line via the switch S11c. The noninverting input terminal of the operational amplifier 4 and the output terminal thereof are connected to the ground line (predetermined potential) and the signal output terminal 3 respectively. The switch Sf is connected between the output terminal of the operational amplifier 4 and the inverting input terminal thereof.

Next, the operation of the present embodiment will be described below.

FIG. 7 shows a sampling state VIIA for an input voltage Vin, a charge adding state VIIB in which charge is transferred from the capacitor C11 to the capacitor C10 for the purpose of amplification at a magnification of 2, and a sampling state VIIC for an amplified voltage which are equivalent to the first state, second state, and third state termed in the present invention. Arrows among the drawings signify that a transition is made from one state to another in the process of amplification.

First, the switches S11b and Sf are turned on and the switch S11c is turned off. The switches S10a and S11a have the states thereof switched to close the connections to the signal input terminal 2 (Vin). In the sampling state VIIA, charge CVin dependent on the input voltage Vin is sampled and accumulated in the capacitors C10 and C11. At this time, the output voltage Vout is 0 V.

After the switch Sf is turned off, the switch S10a has the states thereof switched to close the connection to the signal output terminal 3 (Vout), and the switch S11a has the states thereof switched to close the connection to the ground. The sampling state VIIA is then changed to the charge adding state VIIB. In the charge adding state VIIB, the charge in the capacitor 11 is fully transferred to the capacitor C10 through charge distribution. The charge in the capacitor C10 becomes equal to the sum of the originally accumulated charge CVin and the charge in the capacitor C11 that is equal to the charge CVin, that is, charge expressed as 2·CVin. As a result, amplification is achieved at a magnification of 2 and the output voltage Vout becomes the charge expressed as 2·CVin.

When a higher gain is needed, the switch S11b is turned off and the switch S11c is turned on. The switch S11a has the states thereof switched to close the connection to the signal output terminal 3 (Vout). In the sampling state VIIC, charge dependent on an output voltage Vout, that is, charge identical to that in the capacitor C10 and expressed as 2·CVin is sampled and accumulated in the capacitor C11. Thereafter the charge adding state VIIB is restored. The charge in the capacitor C11 is fully transferred to the capacitor C10 through charge distribution. The charge in the capacitor C10 becomes equal to the sum of the originally accumulated charge 2 expressed as 2·CVin and the charge in the capacitor C11 expressed as 2·CVin, that is, charge expressed as 4·CVin. As a result, amplification is achieved at a magnification of 2 and the output voltage Vout becomes the charge expressed as 4·CVin.

The cycling operation from the charge adding state VIIB through the sampling state VIIC for an amplified voltage to the charge adding state is repeated until a necessary gain is obtained. The input voltage Vin is amplified at the magnification of a power of 2 according to the number of times of cycling.

As mentioned above, the variable gain amplifier 11 of the present embodiment includes the capacitor C10 that can be connected between the output terminal of the operational amplifier 4 and the inverting input terminal thereof, and the capacitor C11 one of whose terminals can be connected to the output terminal of the operational amplifier 4 and the other of whose terminals can be connected at least to the inverting input terminal of the operational amplifier 4. The capacitor C11 is used to transfer the charge dependent on the input voltage Vin or output voltage Vout to the capacitor C10 after the charge is sampled. The capacitor C10 is used to add the transferred charge to the originally accumulated charge and hold the resultant charge.

According to the present embodiment, amplification at a magnification of 2 is achieved with every cycling operation of cycling once the charge adding state in which charge is transferred from the capacitor C11 to the capacitor C10 and the sampling state in which the charge dependent on the output voltage Vout is sampled and accumulated in the capacitor C11. Consequently, a gain equivalent to a magnification of the n-th power of 2 can be attained by increasing the number of times of cycling without the necessity of increasing the number of capacitors. Compared with the conventional variable gain amplifier, an occupied area in a layout can be reduced.

Third Embodiment

Next, the third embodiment is applied will be described with reference to FIG. 8 to FIG. 9.

Figure 8:
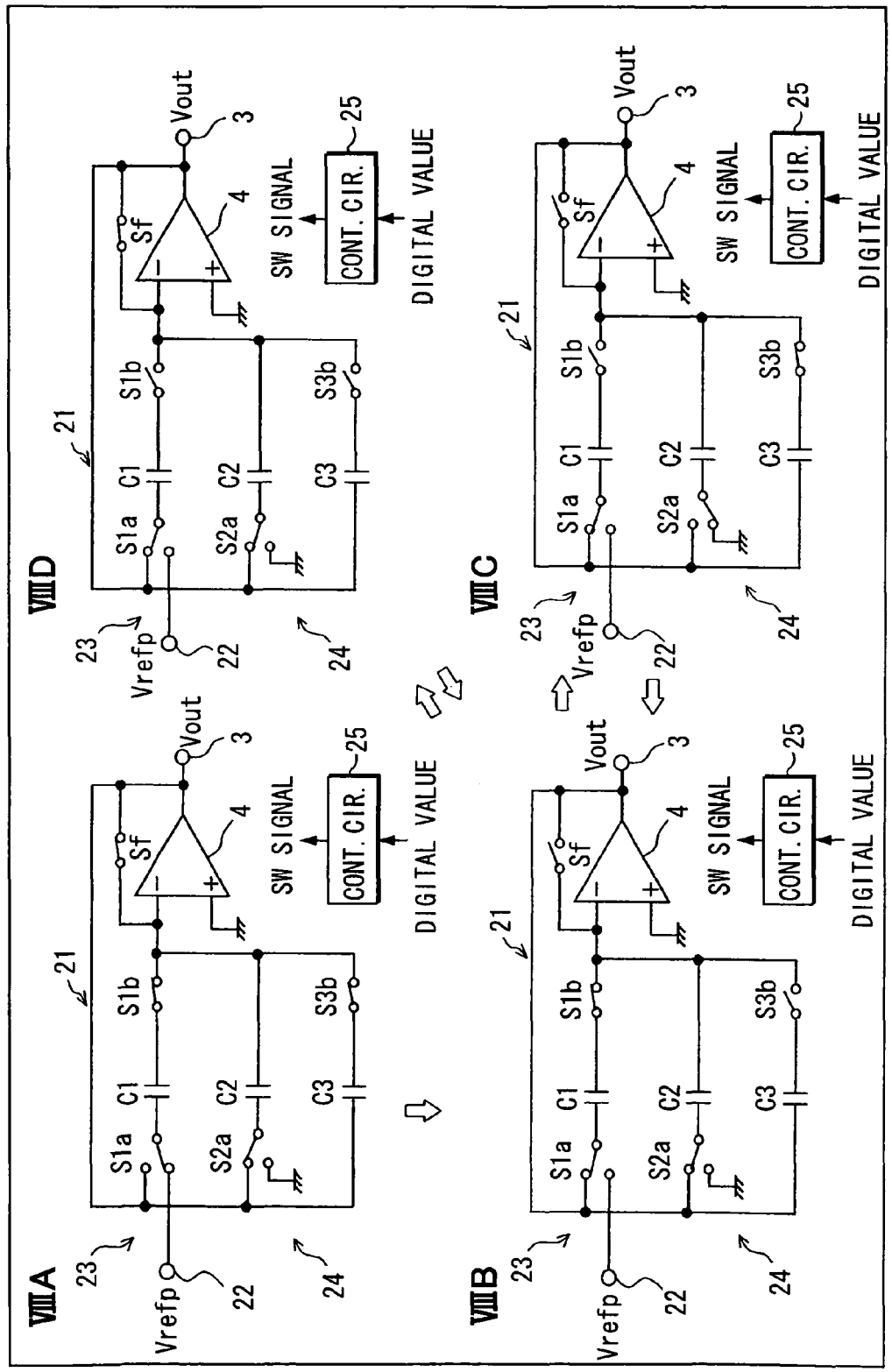
FIG. 8 shows the circuitry of a D/A converter in accordance with a third embodiment, and switched states of switches.

FIG. 8 shows the circuitry of a D/A converter and switched states of switches. The same reference numerals are assigned to components identical to those shown in FIG. 1. The D/A converter 21 is included in, for example, a microcomputer incorporated in an ECU mounted in a vehicle. A certain reference voltage Vrefp is inputted through an input terminal 22, and an analog voltage Vout obtained by D/A-converting a digital value that is a binary code is outputted through a signal output terminal 3.

The D/A converter 21 includes an operational amplifier 4, capacitors C1, C2, and C3 equivalent to the first, second, and third capacitors, and switches S1a, S1b, S2a, S3b, and Sf. The major circuitry portion is identical to the circuitry shown in FIG. 1 except that: the signal input terminal 2 is replaced with the input terminal 22 for the reference voltage Vrefp; the switch S3a is excluded; and one of the terminals of the capacitor C3 is connected to the output terminal of the operational amplifier 4. The capacitors C1, C2, and C3 exhibit the same electrostatic capacitance C. The switches S1a to Sf are formed with analog switches, and have the states thereof switched with a switching signal outputted from a control circuit 25 that is equivalent to the control means and included in the microcomputer incorporated in the ECU.

A charge division means 23 includes the operational amplifier 4 and the capacitors C1 and C2. The charge division means 23 initially accumulates charge, which is dependent on the reference voltage Vrefp, in the capacitor C1, divides the accumulated charge according to a preset ratio of 1/2, and accumulates the resultant charge in the capacitors C1 and C2 again. A charge cumulation means 24 includes the operational amplifier 4 and the capacitors C2 and C3. The charge cumulation means 24 initializes the charge accumulated in the capacitor C3 to a nil, adds the accumulated charge to the charge accumulated in the capacitor C2 included in the charge division means 23, and accumulates the result of the addition again.

FIG. 8 shows a sampling state VIIIA for the reference voltage Vrefp, a charge distributing state VIIIB or voltage dividing state VIIIB in which charge is distributed between the capacitors C1 and C2, a charge initializing state VIIID for the capacitor C2, and a charge adding state VIIIC in which charge is transferred from the capacitor C2 to the capacitor C3 which are equivalent to the first state, second state, third state, and forth state respectively termed in the present invention. Arrows among the drawings signify that a transition is made from one state to another in the process of D/A conversion.

Figure 9:
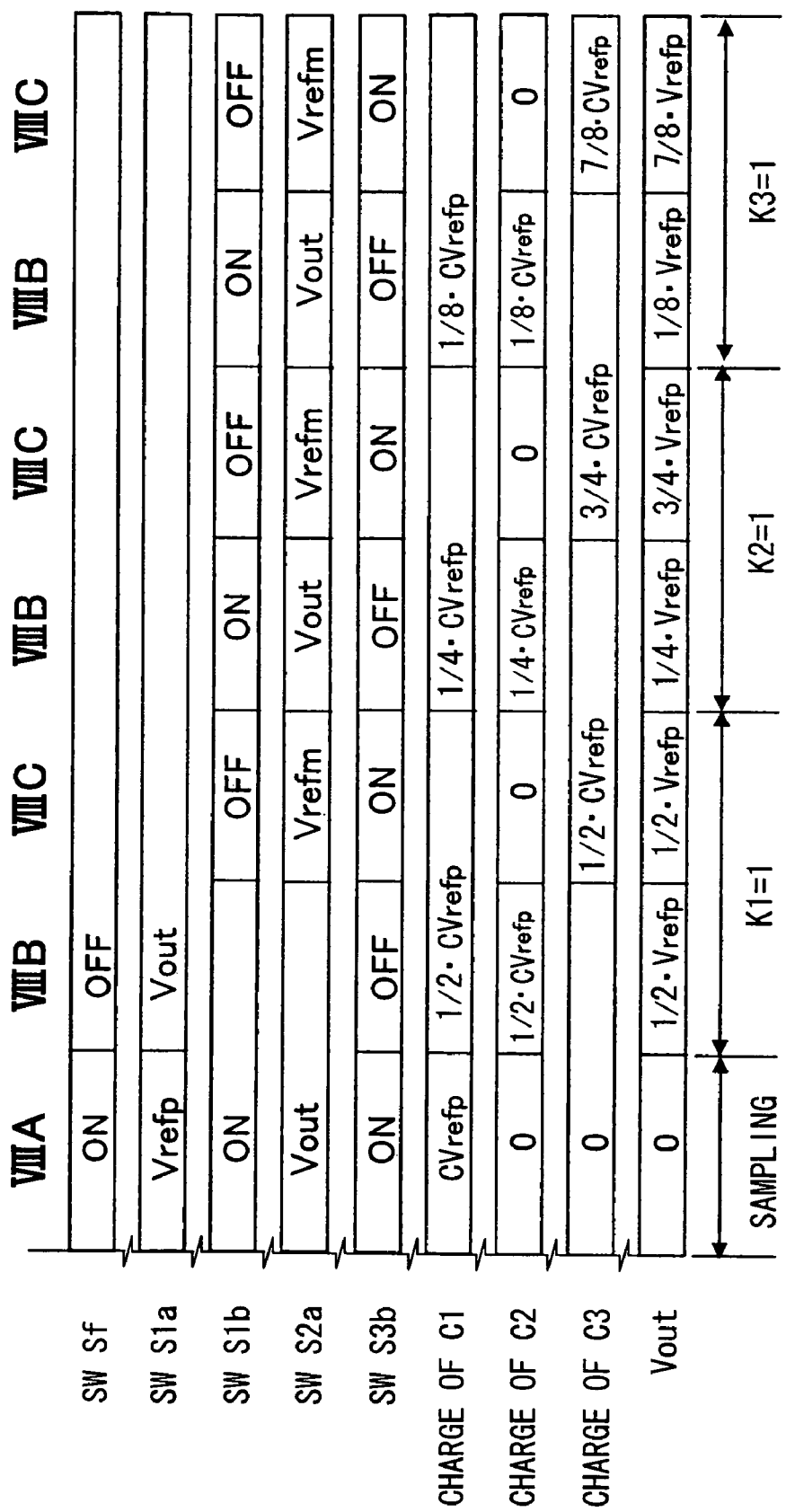
FIG. 9 is a timing chart concerning a case where a digital value of 111 is D/A-converted.

FIG. 9 is a timing chart concerning a case where a 3-bit digital value of 111 is D/A-converted in order to produce an analog output voltage Vout expressed as 7/8·CVrefp. To begin with, the switches S1b, S3b, and Sf are turned on. The switch S1a has the states thereof switched to close the connection to the input terminal 22 (Vrefp), and the switch S2a has the states thereof switched to close the connection to the signal output terminal 3 (Vout). In the sampling state VIIIA, charge CVrefp dependent on the reference voltage Vrefp is sampled and accumulated in the capacitor C1, and the charges in the capacitors C2 and C3 are initialized to a nil. At this time, the output voltage Vout is 0 V.

Thereafter, after the switches Sf and S3b are turned off, the switches S1a has the states thereof switched to close the connection to the signal output terminal 3 (Vout). The sampling state VIIIA is then changed to the charge distributing state VIIIB. In the charge distributing state VIIIB, the charge in the capacitor C3 is preserved. Since the capacitors C1 and C2 sharing the same capacitance are connected between the output terminal of the operational amplifier 4 and the inverting input terminal thereof, charge is equally distributed between the capacitors C1 and C2. Consequently, the charges in the capacitors C1 and C1 come to be expressed as 1/2·CVrefp. Namely, a charge dividing operation is implemented by the charge division means 23.

Thereafter, the bits of a digital value that is a binary code are handled sequentially from the high-order bit. When a handled bit represents 0 or a first logical level, after the switch S1b is turned off, the switch Sf is turned on. With the charge distributing state VIIIB as an origin, the states are changed in order to restore the charge initializing state VIIID. In the charge initializing state VIIID, the charge in the capacitor C2 is initialized to a nil with the charges in the capacitors C1 and C3 left preserved. The output voltage Vout is 0 V.

When the handled bit represents 1 or a second logical level, the switch S1b is turned off and the switch S3b is turned on. The switch S2a has the states thereof switched to close the connection to the ground held at a potential Vrefm. With the charge distributing state VIIIB as an origin, the states are changed in order to restore the charge adding state VIIIC. In the charge adding state VIIIC, charge is distributed between the capacitor C2 and the capacitor C3 with the charge in the capacity C1 left preserved. Consequently, the charge in the capacitor C3 becomes equal to the sum of the originally accumulated charge and the charge in the capacitor C2. Namely, a charge adding operation is implemented by the charge cumulation means 24.

In this case, since all the three bits represent 1s, an operation of making a transition to the charge adding state VIIIC with the charge distributing state B as an origin is repeated three times, and is terminated in the charge adding state VIIIC. After the first transition is made, the charge in the capacitor C3 corresponds to the sum of the originally accumulated charge of 0 and the charge in the capacitor C2 expressed as 1/2·CVrefp, that is, charge expressed as 1/2·CVrefp. After the second transition is made, the charge in the capacitor C3 corresponds to the sum of the originally accumulated charge expressed as 1/2·CVrefp and the charge in the capacitor C2 expressed as 1/4·CVrefp, that is, charge expressed as 3/4·CVrefp. After the third transition is made, the charge in the capacitor C3 corresponds to the sum of the originally accumulated charge expressed as 3/4·CVrefp and the charge in the capacitor C2 expressed as 1/8·CVrefp, that is, charge expressed as 7/8·CVrefp.

In general, an analog voltage Vout obtained by D/A-converting an n-bit digital value or a binary code of K1K2K3 . . . Kn−1Kn is expressed by an equation (7) below. In this case, assuming that Ki is 1 and Ki+1, Ki+2, etc., and Kn are all 0s, after a transition is made to the charge adding state C with the charge distributing state B as an origin at the i-th time, the operation is terminated.

[Mathematics 5]

$$Vout = \left(K1 \cdot \frac{1}{2} + K2 \cdot \left(\frac{1}{2}\right)^2 + K3 \cdot \left(\frac{1}{2}\right)^3 + \ldots + Kn \cdot \left(\frac{1}{2}\right)^n\right) \cdot Vrefp \quad (7)$$

As mentioned above, the D/A converter 21 of the present embodiment includes the three capacitors C1, C2, and C3 ones of whose terminals are connected or can be connected to the output terminal of the operational amplifier 4 and the others of whose terminals are connected or can be connected to the inverting input terminal of the operational amplifier 4. Above all, the capacitor C1 is used to distribute part of charge, which is accumulated depending on the reference voltage Vrefp, to the capacitor C2. The capacitor C2 is used to transfer charge, which is distributed thereto when a digital value represents the logical level of 1, to the capacitor C3. Moreover, the capacitor C3 is used to add the transferred charge to the originally accumulated charge and hold the resultant charge. The output voltage Vout is determined with the charge accumulated in the capacitor C3.

According to the present means, D/A conversion is enabled by making a transition to the charge initializing state VIIID or charge adding state C with the charge distributing state VIIIB as an origin according to the logical level represented by one of the bits of a digital value or a binary code that are handled sequentially from the high-order bit. As a result, D/A conversion can be achieved at a resolution corresponding to the number of bits, which constitute the binary code, without the necessity of increasing the number of capacitors according to the resolution. Compared with the conventional D/A converter, an occupied area in a layout can be reduced.

Fourth Embodiment

Next, the fourth embodiment is applied will be described with reference to FIG. 10 to FIG. 12.

Figure 10:
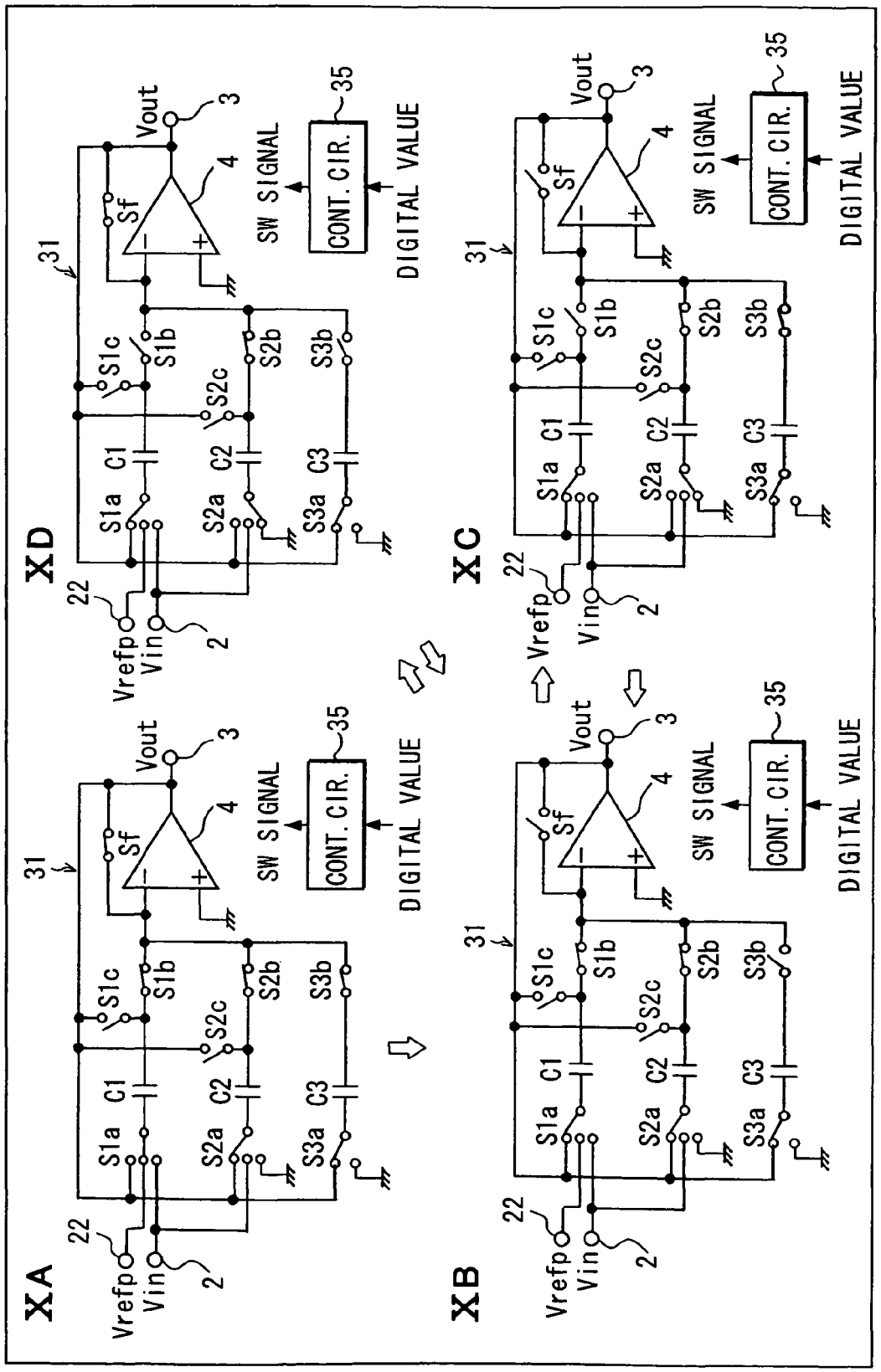
FIG. 10 shows the circuitry of a variable gain amplifier in accordance with a fourth embodiment, and switched states of switches established during an D/A converting operation.
Figure 11:
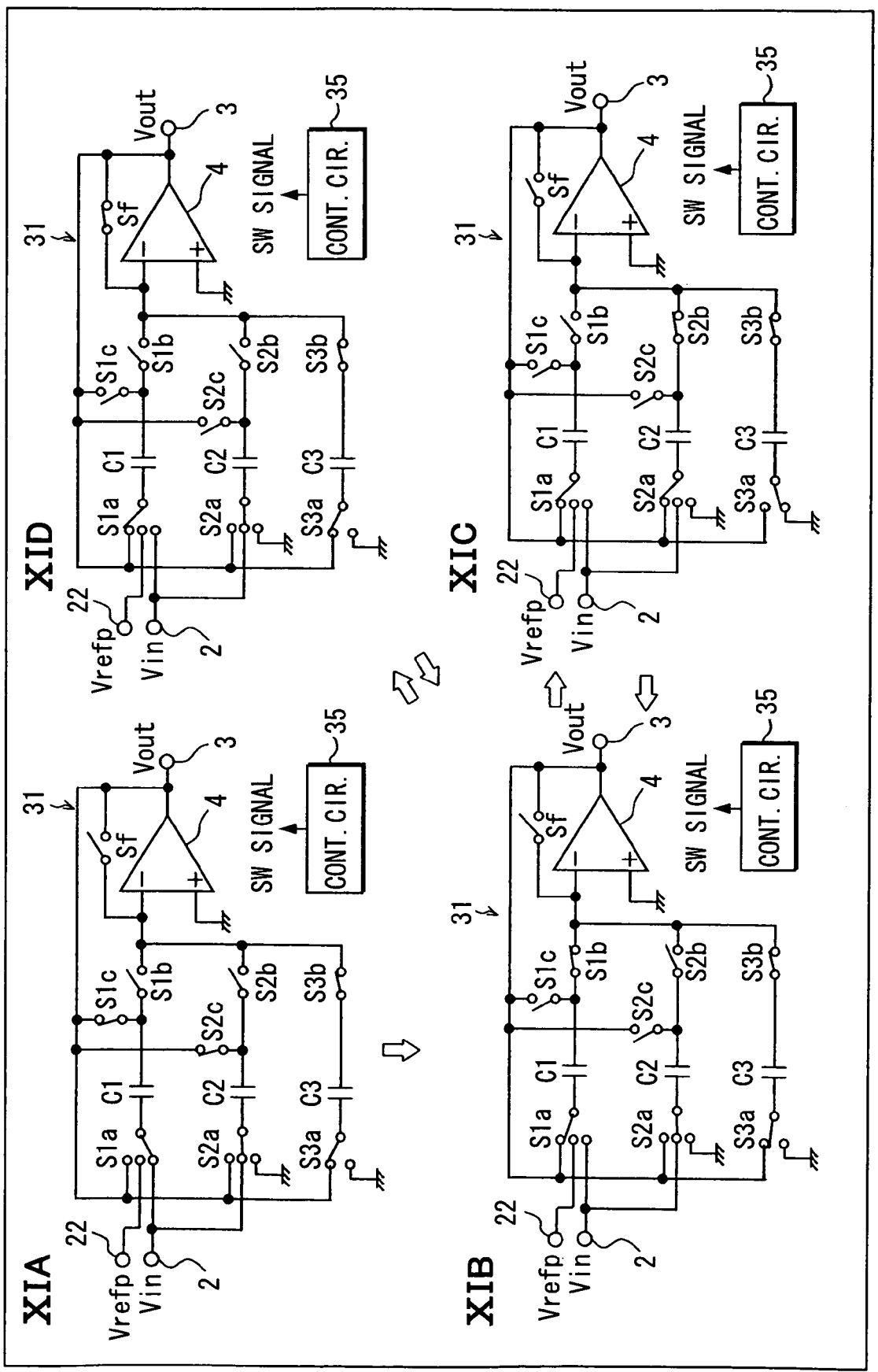
FIG. 11 shows switched states of switches established during an amplifying operation.

FIG. 10 to FIG. 11 show the circuitry of a variable gain amplifier provided with a voltage offsetting facility and switched states of switches. The same reference numerals are assigned to components identical to those shown in FIG. 1 and FIG. 8. The variable gain amplifier 31 has a circuitry equivalent to the combination of the circuitry of the variable gain amplifier 1 shown in FIG. 1 and the circuitry of the D/A converter 21 shown in FIG. 8. After m bits are D/A-converted, an input voltage Vin is offset by the D/A-converted output voltage. The offset voltage or the voltage having undergone offsetting is amplified at a gain permitting an n-bit resolution.

The variable gain amplifier 31 includes an operational amplifier 4, capacitors C1, C2, and C3 equivalent to the first, second, and third capacitors, and switches S1a, S1b, S1c, S2a, S2b, S2c, 53a, 53b, and Sf. The capacitors C1, C2, and C3 exhibit the same electrostatic capacitance C. The switches S1a to Sf are formed with analog switches, and have the states thereof switched with a switching signal outputted from a control circuit 35 equivalent to the control means.

One of the terminals of the capacitors C1 is connected to a signal input terminal 2, an input terminal 22, or the output terminal of the operational amplifier 4 by switching the states of the switch S1a. One of the terminals of the capacitors C2 is connected to the signal input terminal 2, a ground line held at a predetermined potential Vrefm, or the output terminal of the operational amplifier 4 by switching the states of the switch S2a. Moreover, one of the terminals of the capacitor C3 is connected to the ground line (predetermined potential Vrefm) or the output terminal of the operational amplifier 4 by switching the states of the switch S3a. The other terminals of the capacitors C1, C2, and C3 are connected to the inverting input terminal of the operational amplifier 4 via the switches S1b, S2b, and S3b respectively. Further, the other terminals of the capacitors C1 and C2 are connected to the output terminal of the operational amplifier 4 via the switches S1c and S2c respectively.

FIG. 10 shows a sampling state XA for a reference voltage Vrefp, a charge distributing state XB or voltage dividing state XB in which charge is distributed between the capacitors C1 and C2, a charge initializing state XD for the capacitor C2, and a charge adding state XC in which charge is transferred from the capacitor C2 to the capacitor C3 which are equivalent to the first, second, third, and fourth states to be attained during an D/A converting operation. Arrows among the drawings signify that a transition may be made from one state to another in the process of D/A conversion.

FIG. 11 shows a sampling state XIA for a voltage obtained by offsetting an input voltage Vin by a D/A-converted output voltage, a charge distributing state or voltage dividing state XIB in which charge is distributed between the capacitor C1 and capacitor C3, a charge initializing state XID for the capacitor C3, and a charge adding state XIC in which charge is transferred from the capacitor C3 to the capacitor C2 which are equivalent to a fifth state, a sixth state, a seventh state, and an eight state to be attained during an amplifying operation. Arrows among the drawings signify that a transition may be made from one state to another in the process of amplification.

FIG. 12 is a timing charge concerning a case where: a digital value of 001 that is a 3-bit binary code is D/A-converted in order to produce an analog output voltage Vout expressed as 1/8·Vrefp; and an offset voltage having the analog voltage, which is expressed as 1/8·Vrefp, subtracted from the input voltage Vin is then amplified at a predetermined gain corresponding to a magnification equal to or larger than 1 and equal to or smaller than 2. A D/A converting operation is identical to the one described in relation to the third embodiment, and will therefore not be described below. However, since the digital value is 001, after a transition to the charge initializing state XD (see FIG. 10) with the charge distributing state XB (see FIG. 10) as an origin is made twice, a transition is made to the charge adding state XC (see FIG. 10). The D/A converting operation is then terminated. At this time, the charges in the capacitors C1 and C3 are expressed as 1/8·Vrefp.

Thereafter, as shown in FIG. 11, after the switch S2b is turned off, the switches S1c and S2c are turned on. The switches S1a and S2a have the states thereof switched to close the connections to the signal input terminal 2 (Vin). In the sampling state XIA for the offset voltage that is the voltage having undergone offsetting, the capacitor C3 functions as a hold capacitor and has charge C thereof sampled. The charge C expressed as Vin−1/8·Vrefp is accumulated in the capacitors C1 and C2. Thereafter, after the switches S1c and S2c are turned off, the switch Sf is turned on and the charge in the capacitor C3 is initialized to a nil. At this time, the output voltage Vout is 0 V. When amplification is performed at a gain smaller than a magnification of 1, the switch S2c is left off in the state shown in FIG. 11. The charge C expressed as Vin− 1/8·Vrefp is sampled and accumulated in the capacitor C1 alone. The charges in the capacitors C2 and C3 are initialized to a nil.

In the subsequent amplifying operation, the capacitors C2 and C3 of the variable gain amplifier 31 shown in FIG. 11 function like the capacitors C3 and C2 of the variable gain amplifier 1 shown in FIG. 1. Due to a cycling operation or a transitional operation of cycling once the charge distributing state XIB in which charge is distributed between the capacitors C1 and C3 and the charge initializing state XID for the capacitor C3 or the charge adding state XIC in which charge is transferred from the capacitor C3 to the capacitor C2, a gain can be attained for one bit. By repeating the cycling operation n times (where n denotes a value equal to or larger than 1), amplification at a gain permitting an n-bit resolution can be achieved.

A general equation expressing the output of the variable gain amplifier 31 is written as follows:

[Mathematics 6]

$$Vout = \left\{ \sum_{i=0}^{n} Ki \cdot \left(\frac{1}{2}\right)^i \right\} \left[ Vin - \left\{ \sum_{j=1}^{m} Lj \cdot \left(\frac{1}{2}\right)^i \right\} Vrefp \right] \quad (8)$$

where Ki and Lj denote 0 or 1.

As mentioned above, the variable gain amplifier 31 of the present embodiment includes the three capacitors C1, C2, and C3 ones of whose terminals can be connected at least to the output terminal of the operational amplifier 4 and the others of whose terminals can be connected to the inverting input terminal of the operational amplifier 4. The capacitors C1, C2, and C3 and the operational amplifier 4 are used in common between the D/A converting operation and the subsequent amplifying operation. Owing to the circuitry, an analog voltage based on a digital value or binary code can be produced through D/A conversion without an increase in the number of capacitors. Further, a gain permitting an arbitrary resolution can be designated by determining an arbitrary number of times of cycling for the input voltage Vin that is offset by the analog voltage.

Fifth Embodiment

Next, the fifth embodiment is applied will be described with reference to FIG. 13 to FIG. 14.

FIG. 13 shows the circuitry of a variable gain amplifier and switched states of switches. The same reference numerals are assigned to components identical to those shown in FIG. 1 and FIG. 7. The variable gain amplifier 41 includes a charge cumulation means 42, a charge division means 43, and a control circuit 45, but does not includes the switch S10a shown in FIG. 7, and has one terminal of the capacitor C10 directly connected to the output terminal of the operational amplifier 4. Noted is that, in the present embodiment, the capacitor C10 is equivalent to the second capacitor, and the capacitor C11 is equivalent to the first capacitor.

The charge cumulation means 42 and charge division means 43 have the operations thereof closely related to each other, and share the operational amplifier 4 and the capacitors C10 and C11 with each other. After the charge cumulation means 42 initializes the charge accumulated in the capacitor C10, the charge cumulation means 42 cumulatively adds charge, which depends on the input voltage Vin or a predetermined voltage Vrefm of 0 V, to the charge accumulated in the capacitor C10 according to a value represented by one of the bits of a binary code. The charge division means 43 divides the charge accumulated in the capacitor C10 according to a preset ratio of 1/2, and accumulates the charge again.

The variable gain amplifier 41 can attain gains, which correspond to magnifications ranging from 0 to 1, while offering an n-bit resolution according to a binary code. The variable gain amplifier 1 shown in FIG. 1 handles the bits of a binary code sequentially from the most significant bit (MSB) to the least significant bit (LSB). In contrast, the variable gain amplifier 41 of the present embodiment executes the charge cumulating operation to be implemented by the charge cumulation means 42 and the charge dividing operation to be implemented by the charge division means 43 in association with each of the bits of a binary code sequentially from the LSB thereof to the MSB thereof.

Next, the operation of the present embodiment will be described below.

FIG. 13 shows a sampling state XIIIA for the input voltage Vin serving also as a state in which the capacitor C10 is initialized, a charge distributing state XIIIB in which charge is distributed between the capacitors C10 and C11 through the charge cumulating operation and charge dividing operation, a sampling state XIIIC in which the input voltage Vin is sampled and accumulated in the capacitor C11, and a sampling state XIIID in which the voltage Vrefm of 0 V is sampled and accumulated in the capacitor C11. Arrows among the drawings signify that a transition may be made from one state to another in the process of amplification.

Figure 14:
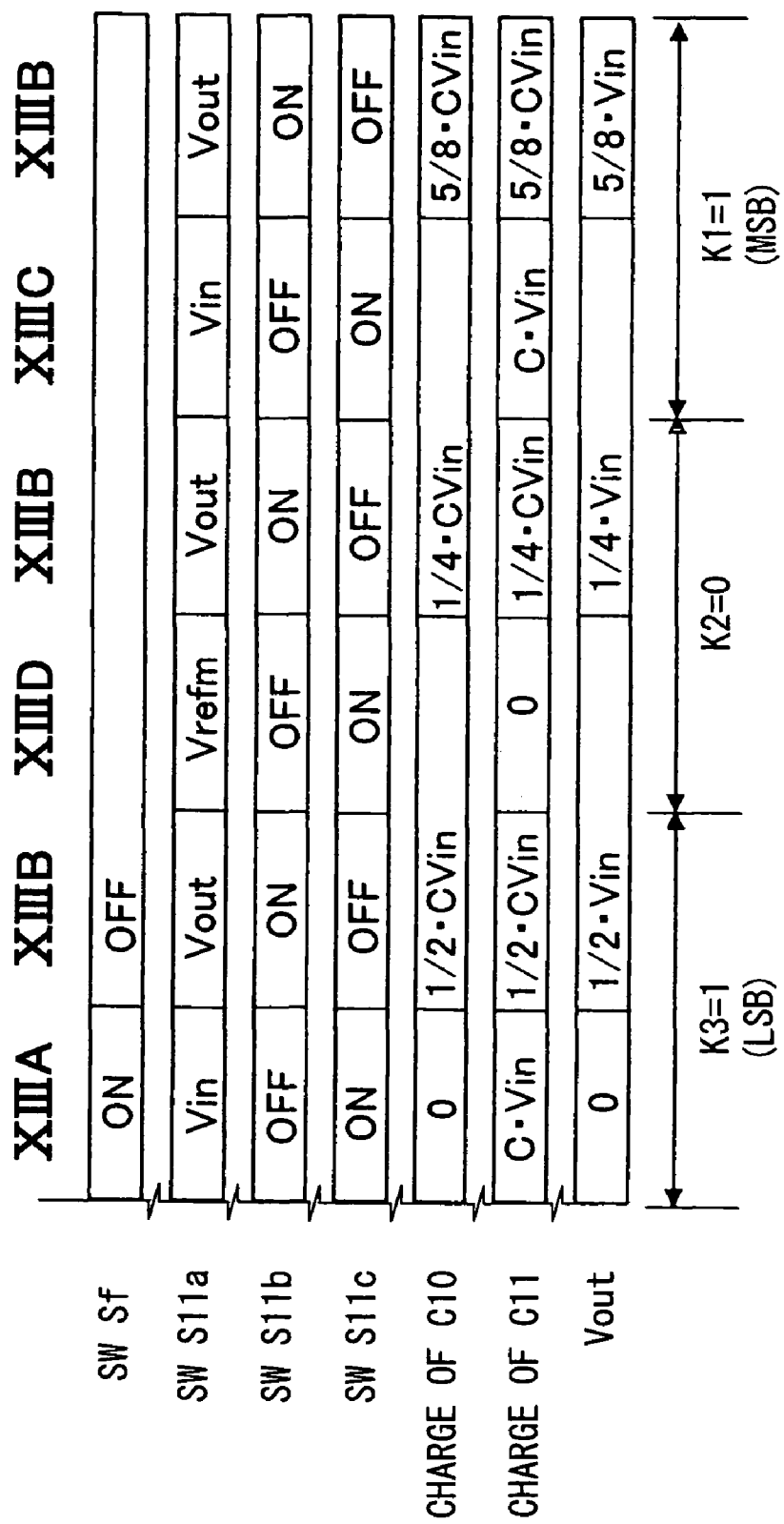
FIG. 14 is a timing chart concerning a case where a designated gain is 5/8.

FIG. 14 is a timing chart concerning a case where a gain designated for the variable gain amplifier 41 is 5/8. In the first sampling state XIIIA, since the LSB of a binary code of K1K2K3 or 101 for which the gain of 5/8 is attained represents 1, the switches S11c and Sf are turned on, and the switch S11b is turned off. The switch S11a has the states thereof switched to close the connection to the signal input terminal 2 (Vin). Consequently, charge CVin dependent on the input charge Vin is sampled and accumulated in the capacitor C11. The sampling state XIIIA also serves as a state in which the charge in the capacitor C10 is initialized. The charge in the capacitor C10 is therefore nullified.

Thereafter, after the switches Sf and S11c are turned off, the switch S11b is turned on, and the switch 11a has the states thereof switched to close the connection to the signal output terminal 3(Vout). The sampling state XIIIA is then changed to the charge distributing state XIIIB. Since the capacitors C10 and C11 sharing the same capacitance are connected between the output terminal of the operational amplifier 4 and the inverting input terminal thereof, addition of charges between the capacitors C10 and C11 and division of charge between them are performed simultaneously. Consequently, the charges in the capacitors C10 and C11 come to be expressed as 1/2·CVin.

Since the next bit K2 represents 0, the switch S11b is turned off and the switch S11c is turned on. The switch S11a has the states thereof switched to close the connection to the voltage Vrefm side. The sampling state XIIID is then established. Consequently, null charge dependent on the voltage Vrefm is sampled and accumulated in the capacitor C11. Thereafter, the sampling state is changed to the charge distributing state XIIIB. Addition of charges and division of charge are simultaneously performed between the capacitors C10 and C11. The charges in the capacitors C10 and C11 come to be expressed as 1/4·CVin.

Since the next bit K1 (MSB) represents 1, the switch S11b is turned off and the switch S11c is turned on. The switch S11a has the states thereof switched to close the connection to the signal input terminal 2 (Vin). The sampling state XIIIC is then established. Consequently, charge CVin dependent on the input voltage Vin is sampled and accumulated in the capacitor C11. Thereafter, the sampling state is changed to the charge distributing state XIIIB. Addition of charges and division of charge are simultaneously performed between the capacitors C10 and C11. The charges in the capacitors C10 and C11 come to be expressed as 5/8·CVin.

Namely, assuming that a binary code K includes, as expressed by an equation (9), bits of K1, K2, K3, etc., Kn−1, and Kn, an output voltage Vout(n) to be provided when the capacitor 10 is initialized is, as expressed by an equation (10), 0. An output voltage Vout(n−1) to be provided by performing addition of charges and division of charge for the first time according to the LSB is expressed as (Vout(n)+Kn·Vin)/2. In association with each of the bits sequentially from the LSB to the MSB, the control circuit 45 executes addition of the charges in the capacitors C10 and C11 and division (1/2) of charge between the capacitors C10 and C11. An output voltage Vout(0) to be provided by performing addition of charges and division of charge in the last place according to the MSB is expressed as (Vout(1)+Kn·Vin)/2. The output voltage is the final output voltage Vout. As a result, the output voltage Vout expressed by an equation (11) below can be provided according to the variable gain determined with the binary code K.

[Mathematics 7]

$$K = \sum_{i=0}^{n} 2^{n-i} \cdot Ki \quad (9)$$

where K denotes a digital value or a code.

$$\begin{aligned} Vout(i-1) &= \frac{1}{2}\{Vout(i) + ki \cdot Vin\} \\ \text{where } i \text{ denotes } n, &\, n-1, n-2, \text{etc., or } 1. \\ Vout(n) &= 0 \\ Vout &= Vout(0) \end{aligned} \quad (10)$$

$$Vout = \left\{K1\left(\frac{1}{2}\right) + K2\left(\frac{1}{2}\right)^2 + K3\left(\frac{1}{2}\right)^3 + \ldots + Kn\left(\frac{1}{2}\right)^n\right\} \cdot Vin \quad (11)$$

As mentioned above, in the present embodiment, a charge cumulating operation to be implemented by the charge cumulation means 42 and a charge dividing operation to be implemented by the charge division means 43 are executed in association with each of the bits of a binary code sequentially from the LSB. Specifically, based on a value represented by any of the bits of the binary code, charge is accumulated in the capacitor C11 in the sampling state XIIIC or XIIID. The sampling state is changed to the charge distributing state XIIIB. Addition of the charges accumulated in the capacitors C10 and C11 and division of charge between them are executed. Consequently, a gain permitting an arbitrary resolution can be attained without the necessity of increasing the number of capacitors according to the resolution. Compared with the conventional variable gain amplifier, an occupied area in a layout can be reduced.

During an amplifying operation, if a value represented by any of the bits of a binary code is recognized as 1, the switch S11a has the states thereof switched to close the connection to the signal input terminal 2 (Vin). The charge dependent on the input voltage Vin is then sampled. Therefore, when a variation in the input voltage Vin occurring during the amplifying operation is small enough, that is, when the frequency of the input voltage Vin is low, the variable gain amplifier 41 of the present embodiment is preferably employed. Moreover, assuming that a sample-and-hold circuit is disposed in a stage preceding the variable gain amplifier 41, even if the frequency is high, an error derived from the variation in the input voltage Vin can be prevented.

Sixth Embodiment

Next, the sixth embodiment is applied will be described with reference to FIG. 15 to FIG. 16.

Figure 15:
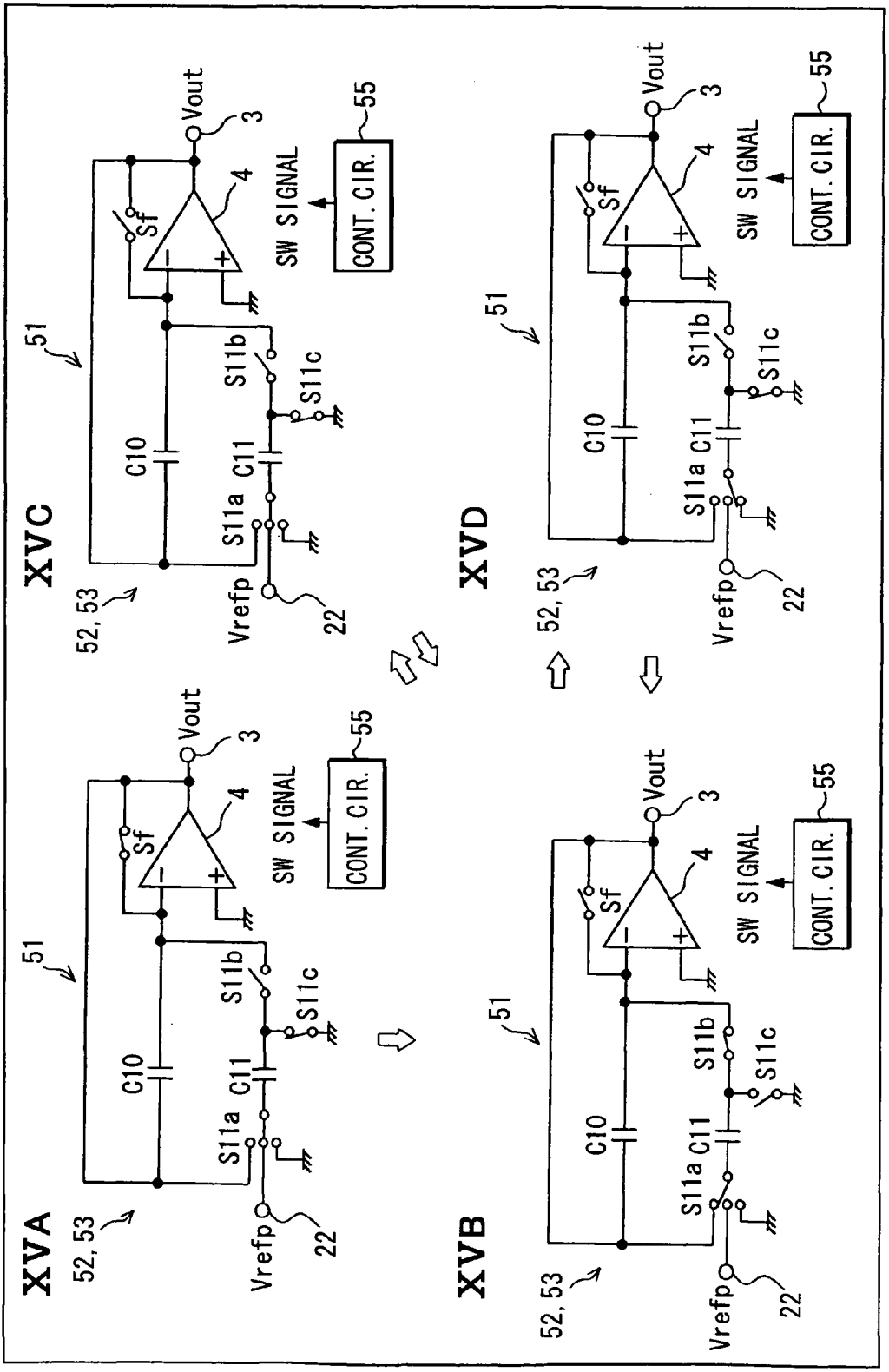
FIG. 15 is equivalent to FIG. 8 and show a sixth embodiment.

FIG. 15 shows the circuitry of a cyclic D/A converter and switched states of switches. The same reference numerals are assigned to components identical to those shown in FIG. 13. The cyclic D/A converter 51 has an operational amplifier 4, capacitors C10 and C11 equivalent to the second and first capacitors, and switches S11a, S11b, S11c, and Sf interconnected in the same manner as those of the variable gain amplifier 41 shown in FIG. 13. A certain reference voltage Vrefp is inputted through an input terminal 22.

A charge cumulation means 52 and a charge division means 53 have the operations thereof closely related to each other, and share the operational amplifier 4 and capacitors C10 and C11 with each other. After the charge cumulation means 52 initializes charge accumulated in the capacitor C10, the charge cumulation means 52 cumulatively adds charge, which depends on a value represented by any of the bits of a binary code or on a predetermined voltage Vrefm of 0 V, to the charge accumulated in the capacitor C10. The charge division means 53 divides the charge accumulated in the capacitor C10 according to a predetermined ratio of 1/2, and accumulates the resultant charge again.

FIG. 15 shows a sampling state XVA for the input voltage Vin serving also as a state in which the capacitor C10 is initialized, a charge distributing state XVB in which charge is distributed between the capacitors C10 and C11 in order to implement a charge adding operation and a charge dividing operation, a sampling state XVC in which a reference voltage Vrefp is accumulated in the capacitor C11, and a sampling state XVD in which a reference voltage Vrefm of 0 V is accumulated in the capacitor C11. Arrows among the drawings signify that a transition may be made from one state to another in the process of amplification.

Figure 16:
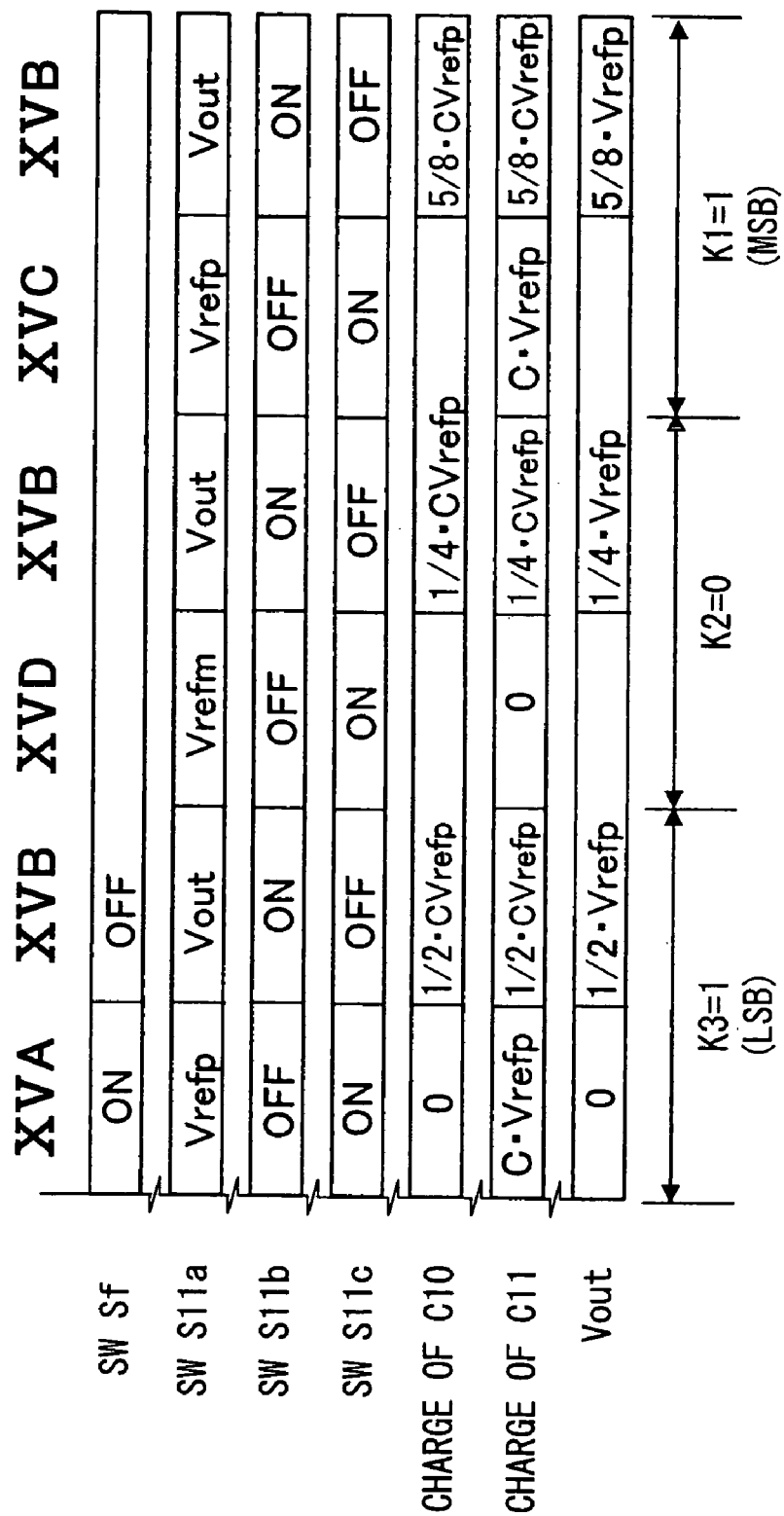
FIG. 16 is a timing chart concerning a case where a digital value of 101 is D/A-converted.

FIG. 16 is a timing chart relating to the D/A converter 51 in a case where a digital value of K1K2K3 that is a binary code is 101. To begin with, the charge in the capacitor C10 is initialized in the state XVA. In association with each of the bits of the binary code sequentially from the LSB thereof, the charge dependent on the reference voltage Vrefp or Vrefm is placed in the capacitor C11 according to a value represented by each bit in the sampling state XVA, XVC, or XVD. The capacitors C10 and C11 are connected between the output terminal of the operational amplifier 4 and the input terminal. Thus, addition of the charges accumulated in the capacitors C10 and C11 and division of charge between them are executed in the charge distributing state XVB in order to implement the charge cumulating operation and charge dividing operation. A switch switching operation to be implemented at that time is identical to that in the variable gain amplifier 41 described in relation to the fifth embodiment. An iterative description will be omitted.

Assuming that the binary code K includes, as expressed by an equation (9) below, bits of K1, K2, K3, etc., Kn–t, and Kn, an output voltage Vout(n) provided after initialization of the capacitor C10 is completed is, as expressed by an equation (12), a nil. An output voltage Vout(n–1) provided after addition of charges and division of charge are performed for the first time in association with the LSB is expressed as (Vout (n)+Kn·Vrefp)/2. A control circuit 55 cyclically executes addition of the charges in the capacitors C10 and C11 and division (1/2) of charge between the capacitors C10 and C11 in association with each of the bits sequentially from the LSB to the MSB. An output voltage Vout(0) provided after addition of charges and division of charge are performed last in association with the MSB is expressed as (Vout(1)+Kn·Vrefp)/2. The output voltage Vout(0) is the final output voltage Vout. As a result, an analog output voltage Vout expressed by an equation (13) can be provided based on the binary code K.

[Mathematics 8]

$$K = \sum_{i=1}^{n} 2^{n-i} \cdot Ki \qquad (9)$$

where K denotes a digital value or a code.

$$\left.\begin{array}{l} Vout(i-1) = \frac{1}{2}\{Vout(i) + ki \cdot Vrefp\} \\ \text{where } i \text{ denotes } n, n-1; n-2, \text{ etc., or } 1. \\ Vout(n) = 0 \\ Vout = Vout(0) \end{array}\right\} \qquad (12)$$

$$Vout = \left\{K1\left(\frac{1}{2}\right) + K2\left(\frac{1}{2}\right)^2 + K3\left(\frac{1}{2}\right)^3 + \ldots + Kn\left(\frac{1}{2}\right)^n\right\} \cdot Vrefp \qquad (13)$$

As described above, in association with each of the bits of a digital value or a binary code sequentially from the LSB, the D/A converter 51 of the present embodiment accumulates charge in the capacitor C11 in the sampling state XVC or XVD, and executes addition of the charges accumulated in the capacitors C10 and C11 and division of charge between them in the charge distributing state XVB. As a result of the cycling operation, D/A conversion can offer a resolution, which corresponds to the number of bits included in the digital value, without the necessity of increasing the number of capacitors according to the resolution. Compared with the conventional D/A converter, an occupied area in a layout can be reduced. Moreover, when a sample-and-hold circuit is included in a state succeeding the D/A converter 51 in order to repeat a D/A converting operation and a sample-and-hold operation of the result of the D/A conversion at intervals of a certain cycle, a steady analog voltage output can be provided.

Seventh Embodiment

Next, the seventh embodiment is applied will be described with reference to FIG. 17A and FIG. 17B.

Figure 17A:
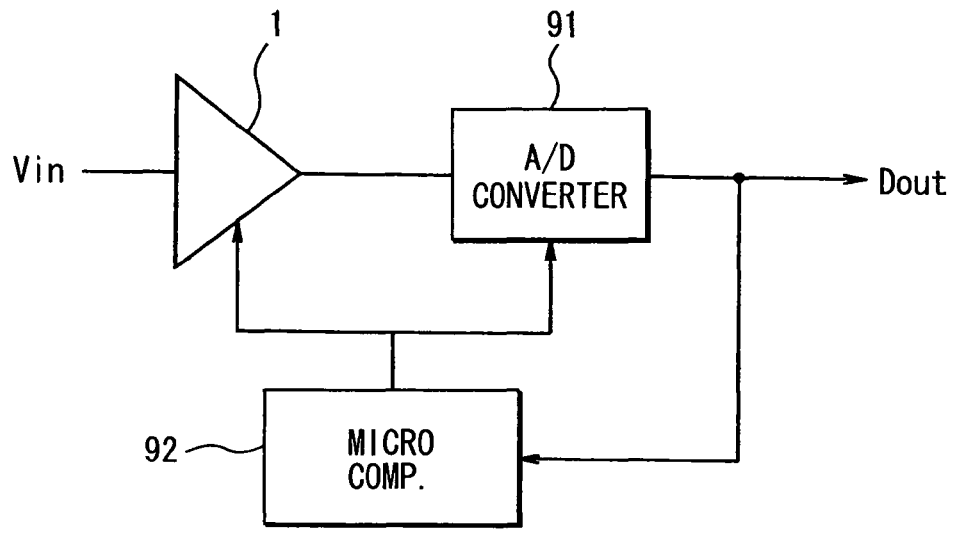
FIGS. 17A and 17B are configuration diagrams showing two types of signal input circuits in accordance with a seventh embodiment.
Figure 17B:
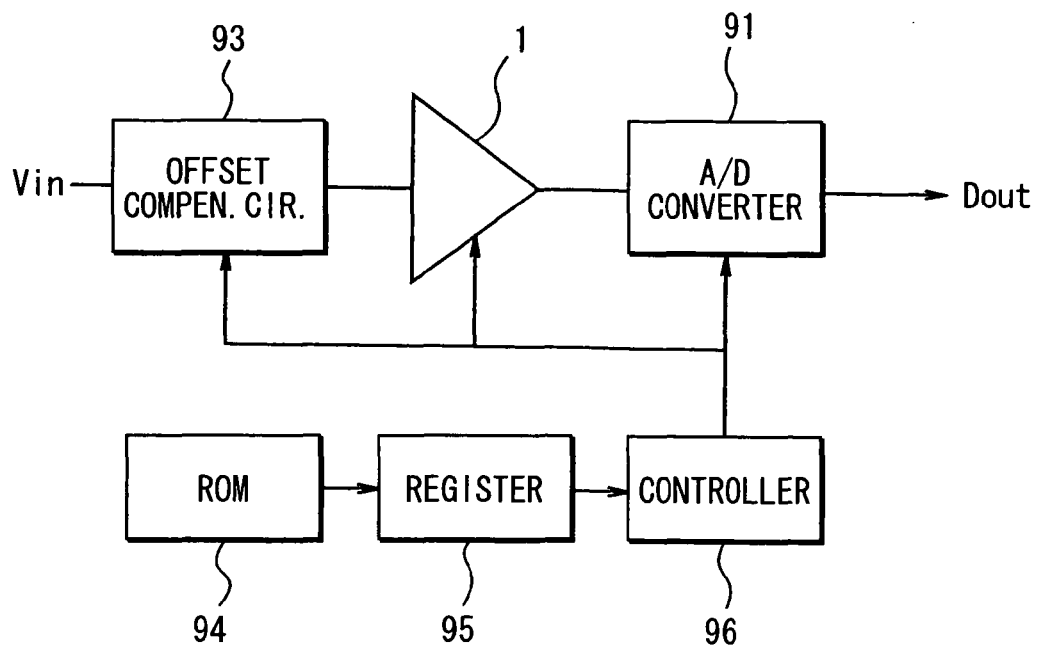

FIG. 17A and FIG. 17B show applied examples of the aforesaid variable gain amplifiers. FIG. 17A shows a signal input circuit in which the variable gain amplifier 1 (see FIG. 1) amplifies an input voltage Vin sent from an onboard sensor that is not shown while correcting sensitivity, and an A/D converter 91 A/D-converts a voltage, which has been amplified to exhibit an appropriate dynamic range, in order to provide digital data Dout.

A microcomputer 92 incorporated in an ECU mounted in a vehicle executes switching control that has been described to be executed by the control circuit 5, and controls a converting operation to be implemented by the A/D converter 91. The microcomputer 92 includes an automatic gain control facility that autonomously designates a gain for the variable gain amplifier 1 prior to amplification of a sensor signal or in the course of amplification of the sensor signal so that digital data Dout provided when the input voltage Vin is a predetermined reference voltage will have a predetermined value.

FIG. 17B shows a signal input circuit in which an offset compensation circuit 93 compensates an offset in the input voltage Vin sent from an onboard sensor, the variable gain amplifier 1 amplifies the input voltage while correcting sensitivity, and the A/D converter 91 then A/D-converts the resultant voltage so as to provide digital data Dout. Offset compensation voltages and designated gains are written in a ROM 94 in association with sensors in an inspection process. A controller 96 reads an offset compensation voltage and a gain from the ROM 94 via a register 95, and controls an offset compensating operation to be implemented by the offset compensation circuit 93 and an amplifying operation to be implemented by the variable gain amplifier 1 according to the offset compensation voltage and gain.

As mentioned above, since the variable gain amplifier 1 is employed in an A/D input circuit for a sensor signal, an occupied area in a layout can be made smaller than that by a conventional variable gain amplifier. As a result, the signal input circuit shown in FIG. 17B can be included in an onboard sensor, and a processing load incurred by the microcomputer in an ECU can be alleviated.

Eighth Embodiment

Figure 18:
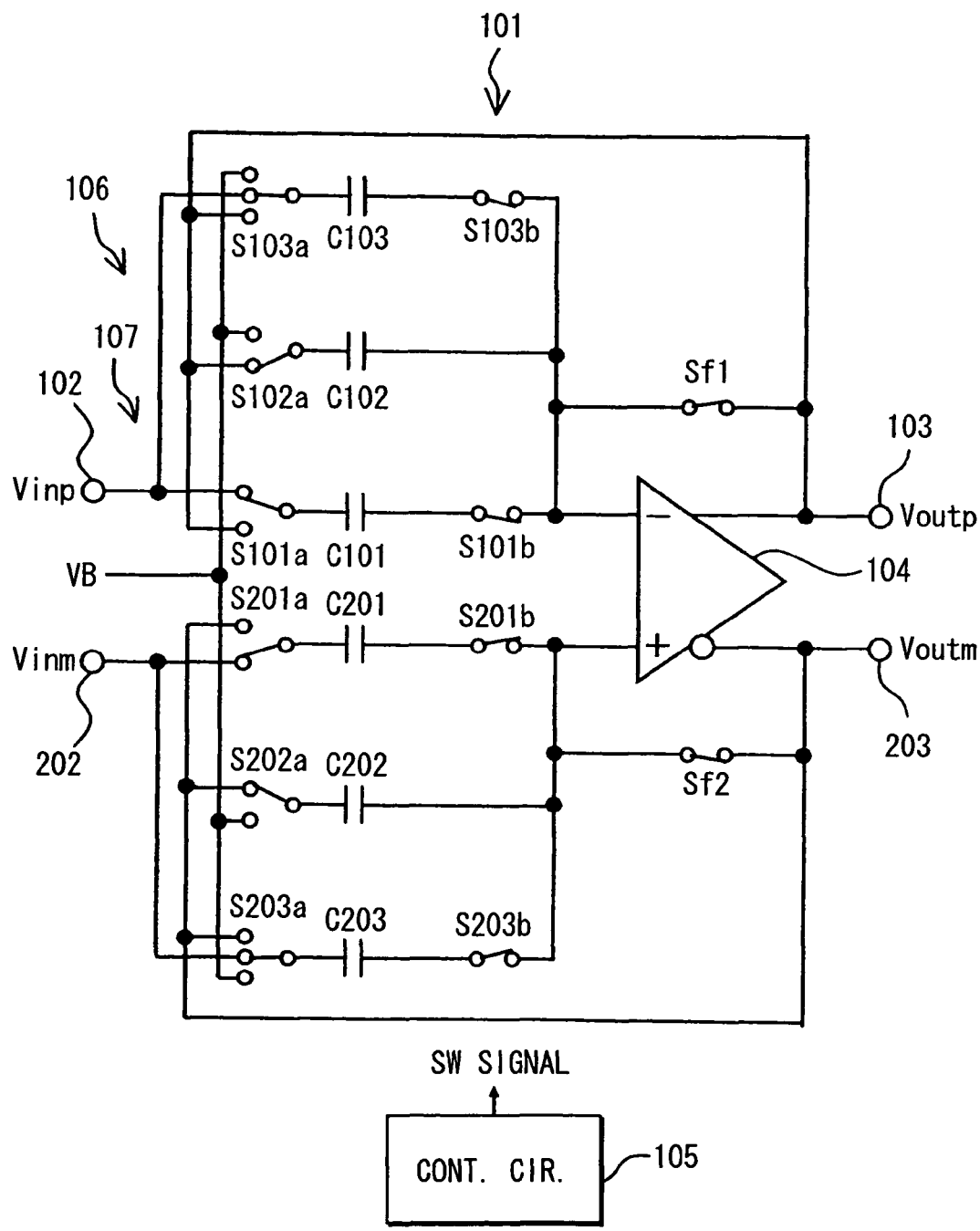
FIG. 18 is a circuit diagram showing a differential type variable gain amplifier in accordance with an eighth embodiment.

FIG. 18 shows the circuitry having the variable gain amplifier 1 shown in FIG. 1 constructed in a differential form. Voltages Vinp and Vinm are inputted to a variable gain amplifier 101 through input terminals 102 and 103 respectively. A voltage produced by differentially amplifying a differential input voltage of the voltages expressed as Vinp−Vinm, that is, a voltage Voutp−Voutm is outputted through signal output terminals 103 and 203.

The variable gain amplifier 101 includes an operational amplifier 104 adopting a differential output form, capacitors C101 and C201 equivalent to the first capacitor, capacitors C102 and C202 equivalent to the second capacitor, capacitors C103 and C203 equivalent to the third capacitor, and switches S101a, S201a, S101b, S201b, S102a, S202a, S103a, S203a, S103b, S203b, Sf1, and Sf2.

The capacitors C101 to C203 exhibit the same electrostatic capacitance C. The switches S101a to Sf2 are formed with analog switches, and have the states thereof switched in response to a switching signal outputted from a control circuit 105 that is equivalent to the control means and is included in a microcomputer in an ECU or a signal processing circuit in a sensor. A charge dividing means 106 includes the operational amplifier 104 and the capacitors C101, C201, C102, and C202. A charge cumulation means 107 includes the operational amplifier 104 and the capacitors C102, C202, C103, and C203. Reference symbol VB denotes a bias voltage.

An operation performed by the variable gain amplifier 101 is identical to that by the variable gain amplifier 1 described in relation to the first embodiment except a point that the variable gain amplifier 101 operates as a differential amplifier. A cycling operation is performed n times (where n denotes a value equal to or larger than 1), whereby a gain permitting an n-bit resolution defined with a binary code can be attained as expressed by the equation (1). Moreover, common-mode noise can be effectively removed through a differentially amplifying operation. Further, since the circuitry is symmetrical between a voltage Vinp side and a voltage Vinm side, and the voltage Vinp side and voltage Vinm side are operated according to the same timing, even if unnecessary charge is injected due to feedthrough at the time of switching the states of switches, an error caused by the injection of charge can be canceled through the differentially amplifying operation.

Ninth Embodiment

Figure 19:
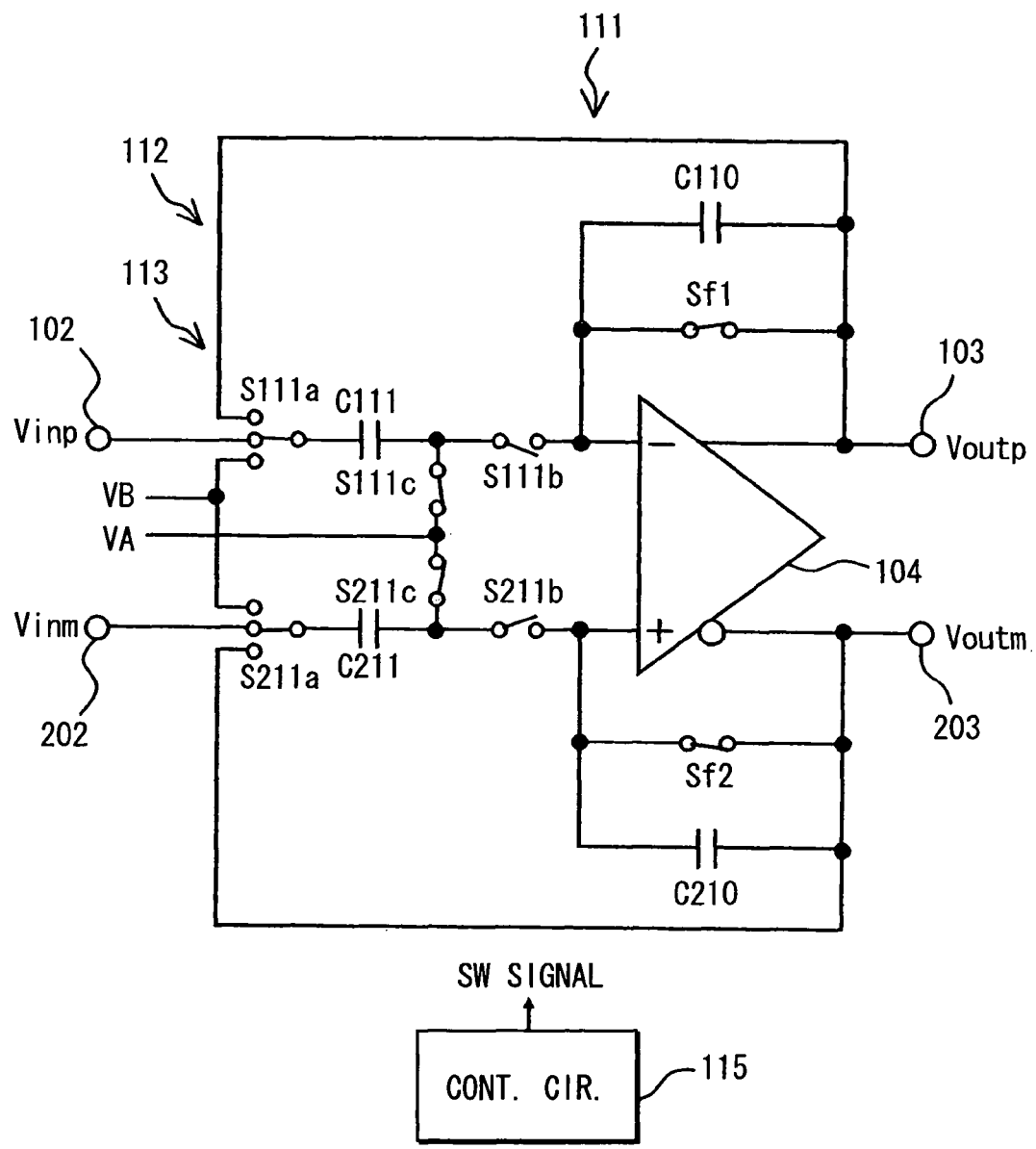
FIG. 19 is equivalent to FIG. 18 and shows a ninth embodiment.

FIG. 19 shows the circuitry having the variable gain amplifier 41 shown in FIG. 13 constructed in a differential form. The same reference numerals are assigned to components identical to those shown in FIG. 18. A variable gain amplifier 111 includes an operational amplifier 104, capacitors C110 and C210 equivalent to the second capacitor, capacitors C111 and C211 equivalent to the first capacitor, and switches S111a, S211a, S111b, S211b, S111c, S211c, Sf1, and Sf2.

The capacitors S110 to C211 exhibit the same electrostatic capacitance C. The switches S111a to Sf2 are formed with analog switches, and have the states thereof switched in response to a switching signal outputted from a control circuit 115 that is equivalent to the control means and is included in a microcomputer in an ECU or a signal processing circuit in a sensor. A charge cumulation means 112 and a charge division means 113 have the operations thereof closely related to each other, and share the operational amplifier 104 and the capacitors C110, C111, C210, and C211 with each other. Reference symbols VA and VB denote appropriate bias voltages that may be identical to each other.

An operation performed by the variable gain amplifier 111 is identical to that by the variable gain amplifier 41 described in relation to the fifth embodiment except a point that the variable gain amplifier 111 operates as a differential amplifier. When the variable gain amplifier 111 operates as a differential amplifier, the same advantage as that of the eighth embodiment is provided.

Tenth Embodiment

Figure 20:
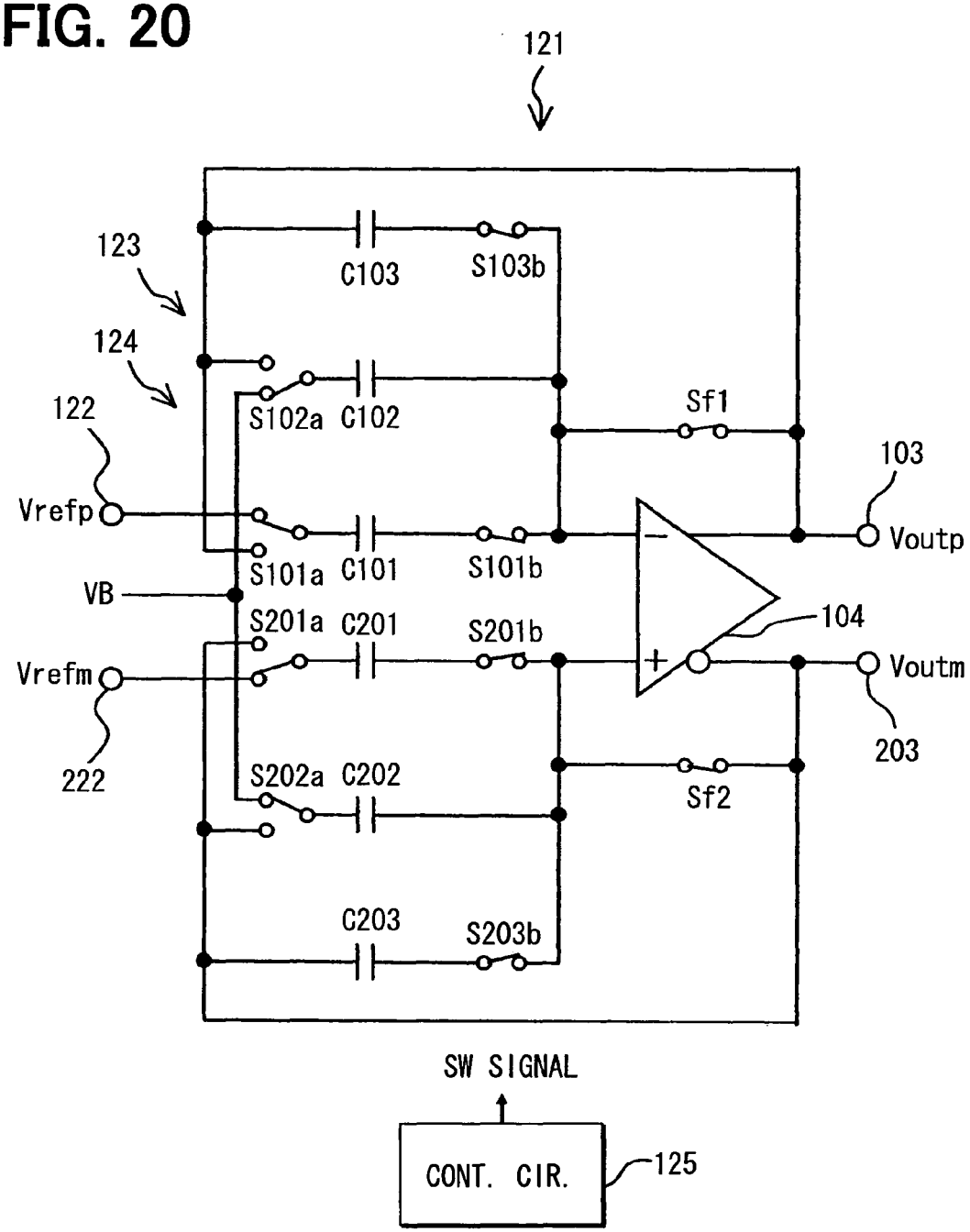
FIG. 20 is a circuit diagram showing a differential type D/A converter in accordance with a tenth embodiment.

FIG. 20 shows the circuitry having the D/A converter 21 shown in FIG. 8 constructed in a differential form. The same reference numerals are assigned to components identical to those shown in FIG. 18. Certain reference voltages Vrefp and Vrefm are inputted to a D/A converter 121 through input terminals 122 and 222 respectively, and an analog voltage produced by D/A-converting a digital value and expressed as Voutp−Voutm is outputted through signal output terminals 103 and 203.

The D/A converter 121 includes an operational amplifier 104, capacitors C101 and C201 equivalent to the first capacitor, capacitors C102 and C202 equivalent to the second capacitor, capacitors C103 and C203 equivalent to the third capacitor, and switches S101a, S201a, S101b, S201b, S102a, S202a, S103b, S203b, Sf1, and Sf2.

The capacitors C101 to C203 exhibit the same electrostatic capacitance C. The switches S101a to Sf2 have the states thereof switched in response to a switching signal outputted from a control circuit 125 that is equivalent to the control means and is included in a microcomputer in an ECU or a signal processing means in a sensor. A charge division means 123 includes the operational amplifier 104 and the capacitors C101, C201, C102, and C202. A charge cumulation means 145 includes the operational amplifier 104 and the capacitors C102, C202, C103, and C203. Reference symbol VB denotes an appropriate bias voltage.

An operation performed by the D/A converter 121 is identical to that by the D/A converter 21 described in relation to the third embodiment except a point that the D/A converter 121 operates as a differential amplifier. When the D/A converter 121 is operated as the differential amplifier, the same advantage as that of the eighth embodiment can be provided.

Eleventh Embodiment

Figure 21:
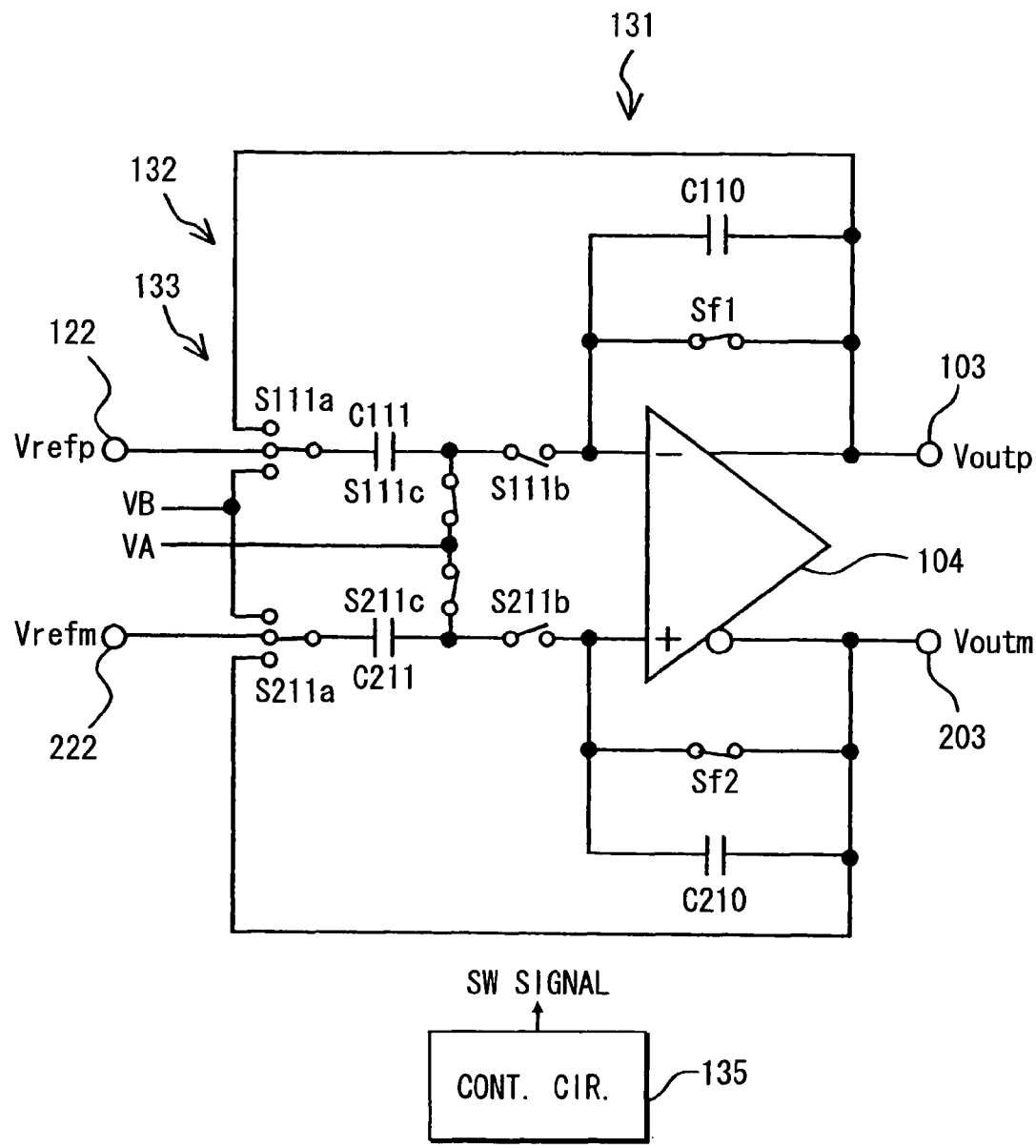
FIG. 21 is equivalent to FIG. 20 and shows an eleventh embodiment.

FIG. 21 shows the circuitry having the D/A converter 51 shown in FIG. 15 constructed in a differential form. The same reference numerals are assigned to components identical to those shown in FIG. 19. A D/A converter 131 includes an operational amplifier 104, capacitors C110 and C210 equivalent to the second capacitor, capacitors C111 and C211 equivalent to the first capacitor, and switches S111a, S211a, S111b, S211b, S111c, S211c, Sf1, and Sf2.

The capacitors C110 to C211 exhibit the same electrostatic capacitance C. The switches S111a to Sf2 have the states thereof switched in response to a switching signal outputted from a control circuit 135 that is equivalent to the control means and is included in a microcomputer in an ECU or a signal processing circuit in a sensor. A charge cumulation means 132 and a charge division means 133 have the operations thereof closely related to each other, and share the operational amplifier 104 and the capacitors C110, C111, C210, and C211 with each other. Reference symbols VA and VB denote appropriate bias voltages that may be identical to each other.

An operation performed by the D/A converter 131 is identical to that by the D/A converter 51 described in relation to the sixth embodiment except a point that the D/A converter 131 operates as a differential amplifier. When the D/A converter 131 is operated as the differential amplifier, the same advantage as that of the eighth embodiment is provided.

Other Embodiments

The present invention is not limited to the embodiments described above and shown in the drawings. For example, variants or extensions described below can be made.

[Variant of the First Embodiment]

Ones of the terminals of the capacitors C1, C2, and C3 may be connected or may be able to be connected at least to the output terminal of the operational amplifier 4, and the other terminals thereof may be connected or may be able to be connected to the inverting input terminal of the operational amplifier 4. In this case, the charge dependent on the input voltage Vin can be accumulated at least in the capacitor C1 and, if necessary, in the capacitor C3. Charge can be distributed between the capacitors C1 and C2 with the charge in the capacitor C3 left preserved. The capacitor C2 can be set to a predetermined charged state with the charges in the capacitors C1 and C3 left preserved. The charge in the capacitor C2 can be transferred to the capacitor C3 with the charge in the capacitor C1 left preserved.

In the sampling state IA for the input voltage Vin, the charge dependent on the input voltage Vin may be accumulated in the capacitor C1 or in the capacitors C1 and C3 according to a gain. The charge in the remaining capacitor C2 or C3 may be initialized to a value other than a nil. Moreover, the initialization in the sampling state A is not limited to a circuit mode in which the output terminal of the operational amplifier 4 and the inverting input terminal thereof are connected to each other and the capacitor C2 or C3 to be initialized is connected between the output terminal of the operational amplifier 4 and the inverting input terminal thereof.

In the charge initializing state ID for the capacitor C2, the charge in the capacitor C2 may be set to a value other than a nil. In the charge adding state IC, part of the charge in the capacitor C2 may be transferred to the capacitor C3.

For preservation of the charges in the capacitors C1, C2, and C3, ones of the terminals of the capacitors C1, C2, and C3 may be left open but the other terminals thereof may not be disconnected from the inverting input terminal of the operational amplifier 4.

The electrostatic capacitances exhibited by the capacitors C1, C2, and C3 respectively may be different from one another.

The charge cumulation means 7 may subtract the charge accumulated in the capacitor C2 from the charge accumulated in the capacitor C3 according to a value represented by each bit, and accumulate the result of the subtraction again. Moreover, the charge accumulated in the capacitor C1 may be transferred to the capacitor C3 but the charge accumulated in the capacitor C2 may not be transferred thereto.

[Variant of the Second Embodiment]

The capacitor C10 may merely be able to be connected between the output terminal of the operational amplifier 4 and the inverting input terminal thereof. One of the terminals of the capacitor C11 may be able to be connected at least to the output terminal of the operational amplifier, and the other terminal thereof may be able to be connected at least to the inverting input terminal of the operational amplifier 4. In this case, the charge dependent on the input voltage Vin can be accumulated in the capacitors C1 and C2. The charge in the capacitor C2 can be transferred to the capacitor C1, and charge dependent on an amplified voltage can be accumulated in the capacitor C2.

In the charge adding state VIIB, part of the charge in the capacitor C11 may be transferred to the capacitor C10. In the sampling state VIIC for the amplified voltage, the other terminal of the capacitor C11 may be connected to a point held at a potential other than a ground potential. Otherwise, charge dependent on a fractional voltage of the output voltage may be accumulated in the capacitor C11.

The electrostatic capacitances exhibited by the capacitors C10 and C11 respectively may be different from each other.

[Variant of the Third Embodiment]

Ones of the terminals of the capacitors C1, C2, and C3 may be connected or may be able to be connected at least to the output terminal of the operational amplifier 4, and the other terminals thereof may be connected or may be able to be connected to the inverting input terminal of the operational amplifier 4. In this case, the charge dependent on the reference voltage Vrefp can be accumulated in the capacitor C1, and the charges in the capacitors C2 and C3 can be initialized. Charge can be distributed between the capacitors C1 and C2 with the charge in the capacitor C3 left preserved. The charge in the capacitor C2 can be initialized with the charges in the capacitors C1 and C3 left preserved. The charge in the capacitor C2 can be transferred to the capacitor C3 with the charge in the capacitor C1 left preserved.

The initialization in the sampling state VIIIA for the reference voltage Vrefp is not limited to a circuit mode in which: the output terminal of the operational amplifier 4 is connected to the inverting input terminal thereof; and the capacitors C2 and C3 to be initialized are connected between the output terminal of the operational amplifier 4 and the inverting input terminal thereof.

For preservation of the charges in the capacitors C1, C2, and C3, ones of the terminals of the capacitors C1, C2, and C3 may be left open, but the other terminals of the capacitors C1, C2, and C3 may not be disconnected from the inverting input terminal of the operational amplifier 4.

The electrostatic capacitances exhibited by the capacitors C1, C2, and C3 may be weighted by a predetermined value.

As for the fourth embodiment, the same variants as those of the first and third embodiments may be made.

In the seventh embodiment, the variable gain amplifier 11, 31, or 41 may be substituted for the variable gain amplifier 1. When the variable gain amplifier 31 is employed, the offset compensation circuit 93 shown in FIGS. 17A and 17B may be excluded.

The same variants as those made in the embodiments that operate merely as a variable gain amplifier can be made even in the embodiments that can also operate as a differential amplifier.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A variable gain amplifier for amplifying an input voltage at a gain defined by a binary code, comprising:
    a signal input terminal that inputs the input voltage therein;
    a signal output terminal that outputs an amplified voltage therethrough;
    a charge division means that accumulates a charge, divides an accumulated charge according to a predetermined ratio, and accumulates a divided charge again;
    a charge cumulation means that accumulates a charge, adds or subtracts an accumulated charge with or from the divided charge accumulated in the charge division means, and accumulates a resultant charge again; and
    a controller that initially executes to accumulate the charge corresponding to the input voltage in the charge division means, executes to accumulate the charge corresponding to the input voltage or a predetermined voltage in the charge cumulation means, executes a charge dividing operation by the charge division means according to each bit of the binary code sequentially from a most significant bit, and executes a charge adding or subtracting operation by the charge cumulation means according to an data value in each bit, wherein
    the charge division means includes
        an operational amplifier having an input terminal and an output terminal coupled with the signal output terminal,
        a first capacitor connectable between the output terminal and the input terminal of the operational amplifier and having one end connectable to the signal input terminal so that the first capacitor accumulates the charge corresponding to the input voltage or the predetermined voltage, and
        a second capacitor connectable between the output terminal and the input terminal of the operational amplifier so that the second capacitor accumulates the charge without affecting the charge of the first capacitor,
    the controller executes the charge dividing operation by simultaneously coupling the first and second capacitors between the output terminal and the input terminal of the operational amplifier,
    the charge cumulation means is provided by the operational amplifier, one of the first and second capacitors, and a third capacitor,
    the third capacitor is connectable between the output terminal and the input terminal of the operational amplifier so that the third capacitor accumulates the charge corresponding to the input voltage or the predetermined voltage, and
    the controller transfers the charge accumulated in the first or second capacitor to the third capacitor so that the controller executes the charge adding operation by the charge cumulation means.

2. The variable gain amplifier according to claim 1, wherein the charge division means and the charge cumulation means are provided by a differential amplification manner that a differential input voltage is differentially amplified at the gain defined by the binary code in order to provide a differential output voltage.

3. A variable gain amplifier for amplifying an input voltage at a gain defined by a binary code, comprising:
    a signal input terminal that inputs the input voltage therein;
    a signal output terminal that outputs an amplified voltage therethrough;
    a charge cumulation means that accumulates a charge, and cumulatively adds a charge corresponding to the input voltage or a predetermined voltage to an accumulated charge according to a data value in each bit of the binary code;
    a charge division means that divides the charge accumulated in the charge cumulation means with a predetermined ratio, and accumulates a divided charge; and
    a control means that initializes the charge accumulated in the charge cumulation means, executes a charge cumulating operation by the charge cumulation means and a charge dividing operation by the charge division means according to each bit of the binary code sequentially from a least significant bit, wherein
    the charge cumulation means is provided by
        an operational amplifier having an input terminal and an output terminal coupled with the signal output terminal,
        a first capacitor connectable between the output terminal and the input terminal of the operational amplifier and having one end connectable to the signal input terminal so that the first capacitor accumulates the charge corresponding to the input voltage or the predetermined voltage, and
        a second capacitor connectable between the output terminal and the input terminal of the operational amplifier so that the second capacitor accumulates a predetermined initial charge,
    the charge division means is provided by the operational amplifier, the first capacitor and the second capacitor,
    the control means initializes the charge in the second capacitor,
    the control means executes to accumulate a predetermined change or the charge corresponding to the input voltage in the first capacitor according to a data value of each bit of the binary code sequentially from the least significant bit, and
    the control means executes a charge dividing operation and a charge adding operation with the first and second capacitors by simultaneously coupling the first and second capacitors between the output terminal and the input terminal of the operational amplifier.

4. The variable gain amplifier according to claim 3, wherein the charge division means and the charge cumulation means are provided by a differential amplification manner that a differential input voltage is differentially amplified at the gain defined by the binary code in order to provide a differential output voltage.

5. A variable gain amplifier for amplifying an input voltage at a predetermined gain, comprising:
- a signal input terminal that inputs the input voltage therein;
- a signal output terminal that outputs an amplified voltage therethrough;
- an operational amplifier having a non-inverting input terminal held at a predetermined potential and output terminal connected to the signal output terminal;
- a first capacitor connectable between the output terminal and an inverting input terminal of the operational amplifier;
- a second capacitor having one end connectable at least to the output terminal of the operational amplifier and the other end connectable at least to the inverting input terminal of the operational amplifier; and
- a control means, wherein
- the control means executes a first process and a second process,
- the control means further executes to repeat a third process and the second process alternately according to a predetermined requirement,
- in the first process, the charge corresponding to the input voltage is accumulated at least in each of the first and second capacitors,
- in the second process, the first capacitor is connected between the output terminal and the inverting input terminal of the operational amplifier, and the other end of the second capacitor is connected to the inverting input terminal of the operational amplifier in order to transfer the charge of the second capacitor to the first capacitor,
- in the second process, connection of the first capacitor and connection of the second capacitor are executed simultaneously so that the control means executes charge adding operation, and
- in the third process, the other end of the second capacitor is disconnected to the inverting input terminal of the operational amplifier with connecting the first capacitor between the output terminal and the inverting input terminal of the operational amplifier, and the one end of the second capacitor is connected to the output terminal of the operational amplifier in order to accumulate a charge corresponding to an output voltage in the second capacitor.

6. The variable gain amplifier according to claim 5,
wherein the one end and the other end of the second capacitor are connectable to a terminal held at the predetermined potential, respectively,
wherein, in the second process, the control means connects the one end of the second capacitor to the terminal held at the predetermined potential, and
wherein, in the third process, the control means connects the other end of the second capacitor to the terminal held at the predetermined potential.

7. The variable gain amplifier according to claim 6,
wherein each capacitor has a same electrostatic capacitance.

8. A D/A converter for converting a reference voltage to an analog voltage according to a binary code and outputting the analog voltage, the converter comprising:
- a signal output terminal that outputs the analog voltage therethrough;
- a charge division means that accumulates a charge therein, divides an accumulated charge according to a predetermined ratio, and accumulates a divided charge again;
- a charge cumulation means that accumulates a charge therein, adds an accumulated charge to the charge accumulated in the charge division means, and accumulates an added charge again; and
- a control means, wherein
- the control means initially executes to accumulate a charge corresponding to the reference voltage in the charge division means,
- the control means initializes the charge accumulated in the charge cumulation means,
- the control means executes a charge dividing operation by the charge division means according to each bit of a binary code sequentially from a most significant bit,
- the control means executes a charge adding operation by the charge cumulation means according to a data value in each bit,
- the charge division means includes
  - an operational amplifier having an input terminal and an output terminal connected to the signal output terminal,
  - a first capacitor connectable between the output terminal and the input terminal of the operational amplifier so that the first capacitor accumulates the charge corresponding to the reference voltage, and
  - a second capacitor connectable between the output terminal and the input terminal of the operational amplifier so that the second capacitor accumulates a predetermined charge without affecting the charge accumulated in the first capacitor,
- the control means simultaneously connects the first and second capacitors between the output terminal and the input terminal of the operational amplifier so as to execute the charge dividing operation by the charge division means,
- the charge cumulation means is provided by the operational amplifier, the first or second capacitor, and a third capacitor,
- the third capacitor connectable between the output terminal and the input terminal of the operational amplifier so that the third capacitor accumulates a predetermined initial charge, and
- the control means transfers the charge accumulated in the first or second capacitor to the third capacitor so as to execute the charge adding operation by the charge cumulation means.

9. The D/A converter according to claim 8,
wherein the charge division means includes:
- an operational amplifier having an input terminal and an output terminal connected to the signal output terminal;
- a first capacitor connectable between the output terminal and the input terminal of the operational amplifier so that the first capacitor accumulates the charge corresponding to the reference voltage; and
- a second capacitor connectable between the output terminal and the input terminal of the operational amplifier so that the second capacitor accumulates a predetermined charge without affecting the charge accumulated in the first capacitor, and
wherein the control means connects the first and second capacitors between the output terminal and the input terminal of the operational amplifier so as to execute the charge dividing operation by the charge division means.

10. The D/A converter according to claim 9,
wherein the charge cumulation means is provided by the operational amplifier, the first or second capacitor, and a third capacitor, wherein the third capacitor connectable between the output terminal and the input terminal of the operational amplifier so that the third capacitor accumulates a predetermined initial charge, and wherein the control means transfers the charge accumulated in the first or second capacitor to the third capacitor so as to execute the charge adding operation by the charge cumulation means.

11. The D/A converter according to claim 8, wherein the charge division means and the charge cumulation means are provided by a differential amplification manner that a differential voltage between two reference voltages is converted to the analog voltage corresponding to the binary code in order to provide a differential output voltage.

12. A D/A converter for converting a reference voltage to an analog voltage according to a binary code and outputting the analog voltage, the converter comprising:

a signal output terminal that outputs the analog voltage therethrough;

a charge cumulation means that accumulates charge therein, cumulatively adds an accumulated charge to a charge corresponding to the reference voltage or a predetermined charge, which is different from the charge corresponding to the reference voltage, according to a data value in each bit of the binary code;

a charge division means that divides the charge accumulated in the charge cumulation means according to a predetermined ratio, and accumulates a divided charge therein; and a control means, wherein the control means initializes the charge accumulated in the charge cumulation means, the control means executes a charge cumulating operation by the charge cumulation means and a charge dividing operation by the charge division means according to each bit of the binary code sequentially from a least significant bit, each of the charge cumulation means and charge division means includes an operational amplifier having an input terminal and an output terminal connected to the signal output terminal, a first capacitor connectable between the output terminal and the input terminal of the operational amplifier so that the first capacitor accumulates the charge corresponding to the reference voltage or the predetermined charge different from the charge corresponding to the reference voltage, and a second capacitor connectable between the output terminal and the input terminal of the operational amplifier so that the second capacitor accumulates a predetermined initial charge, the control means initializes the charge in the second capacitor, the control means executes to accumulate the charge corresponding to the reference voltage or the predetermined charge different from the charge corresponding to the reference voltage in the first capacitor according to an data value in each bit of the binary code sequentially from the least significant bit, and the control means simultaneously connects the first and second capacitors between the output terminal and the input terminal of the operational amplifier so that the control means executes an adding operation of the charges accumulated in the first and second capacitors and a dividing operation of the charges between the first and second capacitors.

13. The D/A converter according to claim 12, wherein each of the charge cumulation means and charge division means includes:

an operational amplifier having an input terminal and an output terminal connected to the signal output terminal;

a first capacitor connectable between the output terminal and the input terminal of the operational amplifier so that the first capacitor accumulates the charge corresponding to the reference voltage or the predetermined charge different from the charge corresponding to the reference voltage; and a second capacitor connectable between the output terminal and the input terminal of the operational amplifier so that the second capacitor accumulates a predetermined initial charge, wherein the control means initializes the charge in the second capacitor, wherein the control means executes to accumulate the charge corresponding to the reference voltage or the predetermined charge different from the charge corresponding to the reference voltage in the first capacitor according to an data value in each bit of the binary code sequentially from the least significant bit, and wherein the control means connects the first and second capacitors between the output terminal and the input terminal of the operational amplifier so that the control means executes an adding operation of the charges accumulated in the first and second capacitors and a dividing operation of the charges between the first and second capacitors.

14. The D/A converter according to claim 12, wherein the charge division means and the charge cumulation means are provided by a differential amplification manner that a differential voltage between two reference voltages is converted to the analog voltage corresponding to the binary code in order to provide a differential output voltage.

15. A D/A converter for converting a reference voltage to an analog voltage according to a digital value and outputting the analog voltage, the converter comprising:

a signal output terminal that outputs the analog voltage therethrough;

an operational amplifier having a non-inverting input terminal held at a predetermined potential and an output terminal connected to the signal output terminal;

first, second, and third capacitors, wherein one end of each capacitor is connected or connectable at least to the output terminal of the operational amplifier, and the other end of each capacitor is connected or connectable to the inverting input terminal of the operational amplifier; and a control means, wherein the control means executes first to fourth processes, in the first process, the charge corresponding to the reference voltage is accumulated in the first capacitor, and the charges in the second and third capacitors are initialized, in the second process, the first and second capacitors are simultaneously connected between the output terminal and the inverting input terminal of the operational amplifier in order to distribute the charge between the first and second capacitors with maintaining the charge in the third capacitor in the third process, the charge in the second capacitor is initialized with maintaining the charges in the first and third capacitors according to each bit of the digital value sequentially from a higher bit to a lower bit, in the third process, when one bit represents a first logical level, a starting point is provided by the second process, in the fourth process, when one bit represents a second logical level, a starting point is provided by the second process, and in the fourth process, the third capacitor is connected between the output terminal and the inverting input terminal of the operational amplifier in order to transfer the charge in the second capacitor to the third capacitor with maintaining the charge in the first capacitor so that the control means executes charge adding operation.

16. The D/A converter according to claim 15, wherein, in the first state, the control means connects the output terminal and the inverting input terminal of the operational amplifier, and connects the second and third capacitors between the output terminal and the inverting input terminal of the operational amplifier so that the charges in the second and third capacitors are initialized, and wherein, in the third state, the control means connects the output terminal and the inverting input terminal of the operational amplifier, connects the second capacitor between the output terminal and the inverting input terminal of the operational amplifier so that the charge in the second capacitor is initialized.

17. The D/A converter according to claim 15, wherein, in the fourth state, the control means connects the second capacitor between the inverting input terminal of the operational amplifier and the terminal held at the predetermined potential.

18. The D/A converter according to claim 15, wherein, in the second, third, and fourth states, the control means disconnects the other end of one capacitor, in which charge is preserved, from the inverting input terminal of the operational amplifier.

19. The D/A converter according to claim 18, wherein each capacitor has a same electrostatic capacitance.

20. A variable gain amplifier for converting a reference voltage into an analog voltage according to a digital value, offsetting an input voltage by the analog voltage, amplifying an offset input voltage at a designated gain, and outputting an amplified voltage, the amplifier comprising:

a signal input terminal that inputs the input voltage therein;

a signal output terminal that outputs the amplified voltage therethrough;

an operational amplifier having a non-inverting input terminal held at a predetermined potential and an output terminal connected to the signal output terminal;

first, second, and third capacitors, each of which includes one end connectable or connected to at least the output terminal of the operational amplifier and the other end connectable or connected to the non-inverting input terminal of the operational amplifier; and a control means, wherein the control means executes first to fourth processes so that the reference voltage is converted to the analog voltage corresponding to the digital value, in the first process, the charge corresponding to the reference voltage is accumulated in the first capacitor, and the charges in the second and third capacitors are initialized, in the second process, the first and second capacitors are simultaneously connected between the output terminal and the inverting input terminal of the operational amplifier in order to distribute the charge between the first and second capacitors with maintaining the charge in the third capacitor, in the third process, the charge in the second capacitor is initialized with maintaining the charges in the first and third capacitors according to each bit of the digital value sequentially from a higher bit to a lower bit, in the third process, when one bit represents a first logical level, a starting point is provided by the second process, in the fourth process, when one bit represents a second logical level, a starting point is provided by the second process, and in the fourth process, the third capacitor is connected between the output terminal and the inverting input terminal of the operational amplifier in order to transfer the charge in the second capacitor to the third capacitor with maintaining the charge in the first capacitor so that the control means executes charge adding operation, the control means further executes a fifth process and a sixth process, and furthermore, executes to repeat a seventh process and the sixth process alternately, or to repeat an eighth process and the sixth process alternately according to a predetermined requirement, so that the offset input voltage is amplified at the designated gain, in the fifth process, a charge corresponding to a difference between the input voltage and the analog voltage is accumulated in the first and second capacitors, in the sixth process, the first and third capacitors are connected between the output terminal and an inverting input terminal of the operational amplifier in order to distribute the charge between the first and third capacitors with maintaining the charge in the second capacitor, in the seventh process, the third capacitor is switched to a predetermined charge state with maintaining the charges in the first and second capacitors, and in the eighth process, the second capacitor is connected between the output terminal and the inverting input terminal of the operational amplifier in order to transfer the charge in the third capacitor to the second capacitor with maintaining the charge in the first capacitor.

* * * * *